US012633361B2

(12) United States Patent　　　(10) Patent No.:　US 12,633,361 B2
Lien et al.　　　　　　　　　　　　(45) Date of Patent:　　May 19, 2026

(54) ALL LEVELS PROGRAM OPERATION INTEGRATED WITH CORRECTIVE PROGRAM VERIFY OPERATION IN A MEMORY DEVICE

(71) Applicant: MICRON TECHNOLOGY, INC., Boise, ID (US)

(72) Inventors: Yu-Chung Lien, San Jose, CA (US); Hanping Chen, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 18/785,362

(22) Filed: Jul. 26, 2024

(65) Prior Publication Data

US 2026/0031163 A1　　Jan. 29, 2026

(51) Int. Cl.
　　*G11C 16/24*　　　(2006.01)
　　*G11C 16/10*　　　(2006.01)
　　*G11C 16/34*　　　(2006.01)
(52) U.S. Cl.
　　CPC ........ *G11C 16/3459* (2013.01); *G11C 16/102* (2013.01); *G11C 16/24* (2013.01)
(58) Field of Classification Search
　　CPC .... G11C 16/3459; G11C 16/102; G11C 16/24
　　See application file for complete search history.

(56) References Cited

U.S. PATENT DOCUMENTS

| | | | | |
|---|---|---|---|---|
| 9,530,506 | B2 * | 12/2016 | Rabkin | ............... G11C 11/5628 |
| 2011/0122695 | A1 * | 5/2011 | Li | ...................... G11C 16/0483 |
| | | | | 365/185.05 |

* cited by examiner

*Primary Examiner* — Xiaochun L Chen
(74) *Attorney, Agent, or Firm* — Lowenstein Sandler LLP

(57)　　　　　ABSTRACT

A memory device including a memory array including a set of target memory cells connected to a target wordline; and a first wordline adjacent to the target wordline, wherein the first wordline is to be programmed immediately subsequent to the target wordline; and control logic, operatively coupled with the memory array, to perform operations including causing, during a first time period of a program operation, a ramping wordline voltage to be applied to the set of target memory cells of the target wordline; causing, during the first time period, a disconnection of a set of pillars associated with the set of memory cells from a voltage supply and ground voltage, wherein each pillar corresponds to a respective programming level of a set of programming levels; causing, during a second time period of the program operation, a programming pulse to be applied to the set of target memory cells, wherein the programming pulse programs each programming level of the set of programming levels associated with the set of target memory cells; identify, based on programming level information of the first wordline, a program verify (PV) voltage offset associated with the target wordline; and causing, during a program verify time period of the program operation, a program verify voltage to be applied to the target wordline to verify programming of the set of target memory cells to a target programming level, wherein the program verify voltage is adjusted by the PV voltage offset.

20 Claims, 12 Drawing Sheets

300

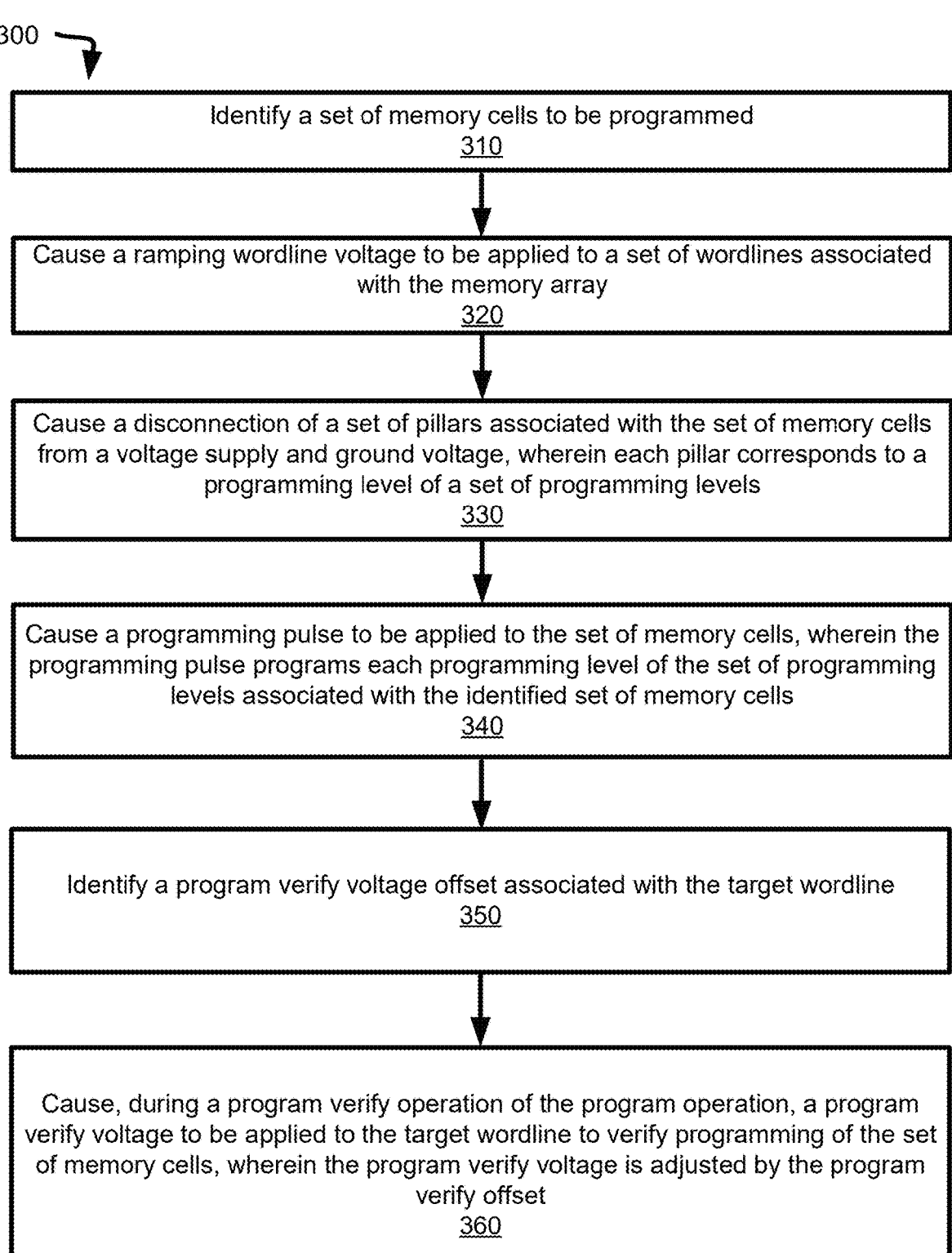

Identify a set of memory cells to be programmed
310

Cause a ramping wordline voltage to be applied to a set of wordlines associated with the memory array
320

Cause a disconnection of a set of pillars associated with the set of memory cells from a voltage supply and ground voltage, wherein each pillar corresponds to a programming level of a set of programming levels
330

Cause a programming pulse to be applied to the set of memory cells, wherein the programming pulse programs each programming level of the set of programming levels associated with the identified set of memory cells
340

Identify a program verify voltage offset associated with the target wordline
350

Cause, during a program verify operation of the program operation, a program verify voltage to be applied to the target wordline to verify programming of the set of memory cells, wherein the program verify voltage is adjusted by the program verify offset
360

800

IDENTIFY WORDLINE GROUPS ON THE MEMORY DEVICE, WHERE EACH WORDLINE GROUP IS ASSOCIATED WITH A CORRESPONDING DEFAULT PROGRAM VERIFY (PV) VOLTAGE FOR EACH RESPECTIVE PROGRAMMING LEVEL OF A MEMORY CELL 802

DETERMINING, FOR EACH WORDLINE GROUP, A MAXIMUM READ WINDOW BUDGET (RWB) INCREASE ASSOCIATED WITH USING A DIFFERENT PROGRAM VERIFY (PV) VOLTAGE OFFSET FOR EACH RESPECTIVE PROGRAMMING LEVEL OF A MEMORY CELL OF THE PLURALITY OF MEMORY CELLS, WHERE EACH PV VOLTAGE OFFSET DEPENDS ON A RESPECTIVE AGGRESSOR MEMORY CELL THRESHOLD VOLTAGE 804

DEFINING A TARGET AGGREGATE RWB INCREASE AMOUNT BASED ON THE MAXIMUM RWB INCREASE 806

DETERMINING, FOR EACH WORDLINE GROUP, A MINIMUM NUMBER OF MEMORY CELL PROGRAMMING LEVEL GROUPS, EACH PROGRAMMING LEVEL GROUP ASSOCIATED WITH A CORRESPONDING PV VOLTAGE OFFSET APPLIED FOR PROGRAMMING A MEMORY CELL TO ANY PROGRAMMING LEVEL WITHIN THE PROGRAMMING LEVEL GROUP, WHERE THE MINIMUM NUMBER IS SUFFICIENT TO REACH THE TARGET AGGREGATE RWB INCREASE AMOUNT 808

GROUPING THE PROGRAMMING LEVELS OF A SPECIFIED MEMORY CELL INTO THE MINIMUM NUMBER OF PROGRAMMING LEVEL GROUPS DETERMINED FOR THE WORDLINE GROUP CONTAINING THE WORDLINE CONNECTED TO THE SPECIFIED MEMORY CELL TO DEFINE ONE OR MORE SPECIFIC PROGRAMMING LEVEL GROUPS 810

IDENTIFYING, BASED ON THE SPECIFIC PROGRAMMING LEVEL GROUP CONTAINING A TARGET PROGRAMMING LEVEL, A CORRESPONDING PV VOLTAGE OFFSET 812

FIG. 8

| Programming Level of target | Categorized Programming Level of aggressor | PV voltage offset |
|---|---|---|
| L1 | C1 | PV voltage offset X1 |
| | C2 | PV voltage offset Y1 |
| - - - - | | |
| Ln | C1 | PV voltage offset Xn |
| | C2 | PV voltage offset Yn |

| Programming Level of target | Categorized Programming Level of aggressor | PV voltage offset |
|---|---|---|
| L0-L3 | C1 | PV voltage offset X3 |
| | C2 | PV voltage offset Y3 |
| L4-L7 | C1 | PV voltage offset X4 |
| | C2 | PV voltage offset Y4 |

ALL LEVELS PROGRAM OPERATION INTEGRATED WITH CORRECTIVE PROGRAM VERIFY OPERATION IN A MEMORY DEVICE

TECHNICAL FIELD

Embodiments of the disclosure relate generally to memory sub-systems, and more specifically, relate to all levels program operation integrated with corrective program verify operation in a memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a flow diagram of an example method of all levels program operation integrated with corrective program verify operation in a memory device in a memory sub-system in accordance with one or more embodiments of the present disclosure.

FIG. 8 is a flow diagram of an example method for managing program verify (PV) voltage offsets in accordance with one or more embodiments of the present disclosure.

DETAILED DESCRIPTION

Figure 1A:
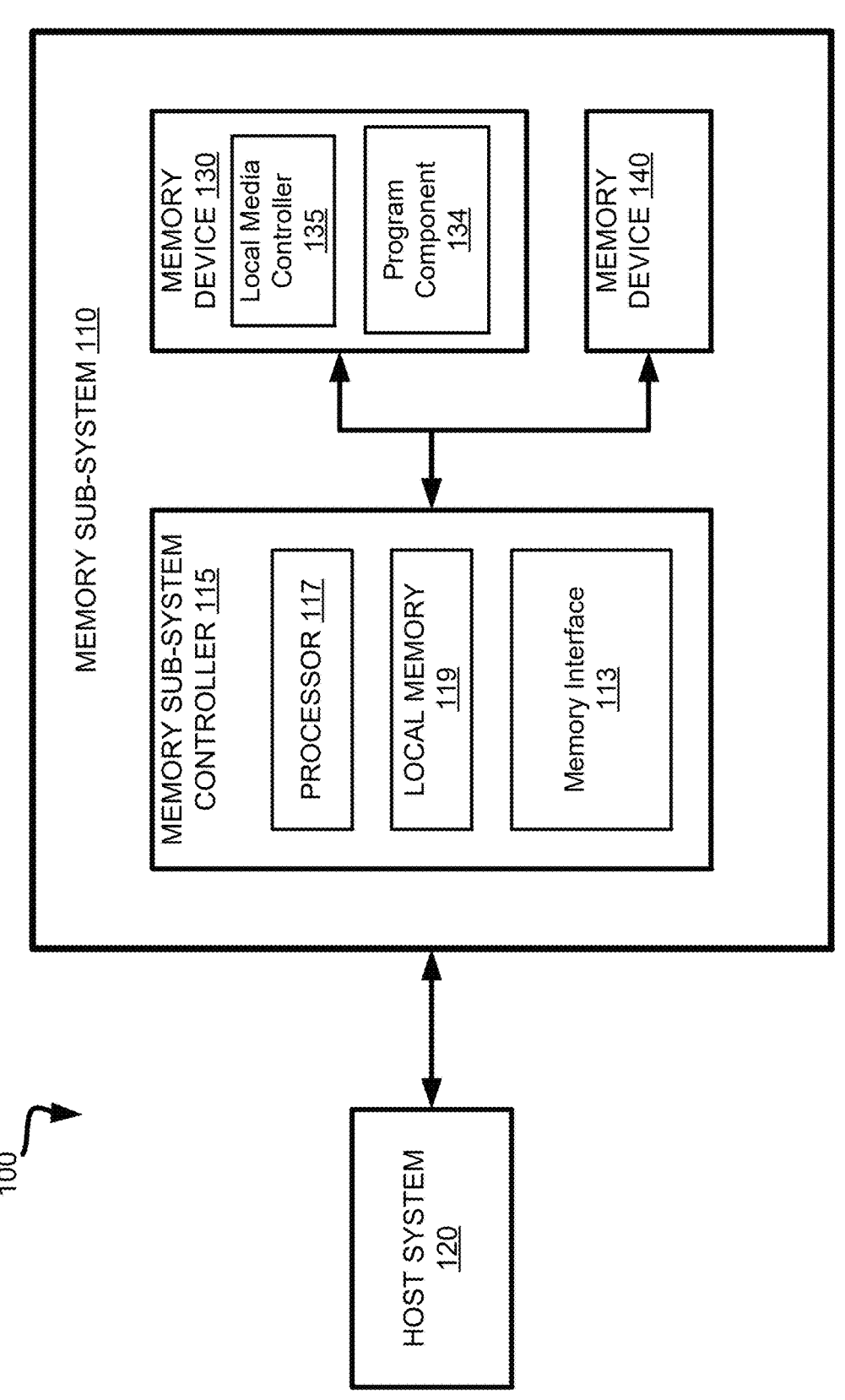
FIG. 1A illustrates an example computing system that includes a memory sub-system, in accordance with one or more embodiments of the present disclosure.

Aspects of the present disclosure are directed to all levels program operation integrated with corrective program verify operation in a memory device in a memory sub-system. A memory sub-system can be a storage device, a memory module, or a hybrid of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. The memory cells are formed onto a silicon wafer in an array of columns (also hereinafter referred to as bitlines) and rows (also hereinafter referred to as wordlines). A wordline can refer to one or more conductive lines of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be generally referred to as independent plane driver circuits. Control logic on the memory device includes a number of separate processing threads to perform concurrent memory access operations (e.g., read operations, program operations, and erase operations). For example, each processing thread corresponds to a respective one of the memory planes and utilizes the associated independent plane driver circuits to perform the memory access operations on the respective memory plane. As these processing threads operate independently, the power usage and requirements associated with each processing thread also varies.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain-side and the second side can be a source-side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The cells can, therefore, be characterized by a distribution P of the threshold voltages, $P(Q, V_T)=dW/dV_T$, where dW represents the probability that any given cell has its threshold voltage within the interval $[V_T, V_T+dV_T]$ when charge Q is placed on the cell.

A memory device can exhibit threshold voltage distributions $P(Q, V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, $k=1, 2, 3 \ldots$. The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. A memory device can include one or more arrays of memory cells such as SLCs, MLCs, TLCs, QLCS, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. As yet another example, in a QLC cell, there are 16 read windows that exist with respect to the 16 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

Memory access operations (e.g., a program operation, an erase operation, etc.) can be executed with respect to the memory cells by applying a wordline bias voltage to wordlines to which memory cells of a selected page are connected. For example, during a programming operation, one or more selected memory cell can be programmed with the application of a programming voltage to a selected wordline. In one approach, an incremental step pulse programming (ISPP) process or scheme can be employed to maintain a tight cell threshold voltage distribution for higher data reliability. In ISPP, a series of high-amplitude pulses of voltage levels having an increasing magnitude (e.g., by a predefined pulse step height) are applied to wordlines to which one or more memory cells are connected to gradually raise the voltage level of the memory cells to above a wordline voltage level corresponding to the memory access operation (e.g., a target program level). The application of the uniformly increasing pulses by a wordline driver of the memory device enables the selected wordline to be ramped or increased to a wordline voltage level ($V_{wl}$) corresponding to a memory access operation. Similarly, a series of voltage pulses having a uniformly increasing voltage level can be applied to the wordline to ramp the wordline to the corresponding wordline voltage level during the execution of an erase operation.

The series of incrementing voltage programming pulses are applied to the selected wordline to increase a charge level, and thereby a threshold voltage, of each memory cell connected to that wordline. After each programming pulse, or after a number of programming pulses, a program verify operation is performed to determine if the threshold voltage of the one or more memory cells has increased to a desired programming level. For example, the pulses can be incrementally increased in value (e.g., by a step voltage value such as 0.33V) to increase a charge stored on a charge storage structure corresponding to each pulse. The memory device can reach a target programming level voltage for a particular programming level by incrementally storing or increasing amounts of charge corresponding to the programming step voltage.

According to this approach, the series of programming pulses and program verify operations are applied to program each programming level (e.g., programming levels L1 to L7 for a TLC memory cell) in sequence. For example, this approach sequentially programs the levels of the memory cell (e.g., L1 to L7) by applying a first set of pulses to program level L1 to a first target voltage level, followed by the application of a second set of pulses to program level L2 to a second target voltage level, and so on until all of the levels are programmed.

In this approach, each level may require multiple programming pulses and program verify operations to reach the target programming voltage associated with the respective programming level. Accordingly, this results in a long time to program (e.g., a time from an initial programming pulse until the program verify threshold voltage is reached, also referred to as Tprog) associated with the one or more memory cells. For example, programming each level of a TLC memory cell (e.g., programming levels L1 to L7) one at a time requires a high number of total programming pulses (e.g., approximately 24 pulses) and a high number of associated program verify operations (e.g., approximately 42 program verify operations). In this example, if a time associated with each pulse is 37.5 μs, resulting in a total time for the set of pulses (i.e., 24 pulses) of 900 μs. In addition, the time associated with performing the program verify operations can add an additional 900 μs, resulting in a total program time of, for example, 1800 μs. In addition, programming each level in sequence results in a higher energy per bit and a higher peak current levels, which cause performance degradation. In particular, this approach requires faster wordline ramping which causes high peak current levels or spikes. Therefore, there is a need to improve the performance of the memory device, including reducing Tprog.

On the other hand, there is also a need to improve the reliability of the memory device, including increasing read window budget (RWB). This is especially the case when a desire for increased storage capacity in memory devices drives an expansion of block sizes, including an increase of the number of wordlines in each block, the presence of such additional wordlines, however, presents certain challenges including, for example, performance and reliability penalties attributable to various inefficiencies (e.g., associated with garbage collection or other media management operations for the increased block size). For example, cell-to-cell interference (also referred to as "C2C interference") may exist in a memory array between the target cells and their respective groups of adjacent cells. Cell-to-cell interference can lead to Vt distribution shift. Cell-to-cell interference, in addition to intrinsic charge loss, can further lead to a widening of $V_T$ distributions. The $V_T$ distribution widening can cause RWB degradation, which can negatively affect memory device reliability. For example, RWB degradation can lead to an increase in the number of errors (e.g., bit errors) and/or error rate (e.g., bit error rate (BER)). Cell-to-cell interference can result in the loss of RWB in view of the Vt difference between cells on a target wordline (WLn) and neighboring wordlines, mostly the subsequent neighbor wordline (WLn+1). Specifically, cell-to-cell interference can cause the threshold voltage of the target wordline to shift up, with a larger shift occurring as the threshold voltage of WLn+1 increases.

Aspects of the present disclosure address the above and other deficiencies by implementing a new program scheme using all levels program (ALP) operation integrated with corrective program verify (CPV) operation in a memory device in a memory sub-system. This ALP-CPV scheme can provide a balanced tradeoff between the performance of the memory device (e.g., reduced Tprog) and the reliability of the memory device (e.g., improved RWB).

In all levels program (ALP) operation, rather than sequentially programming the multiple programming levels (e.g., levels L1 to L7 of a TLC memory cell), each programming pulse programs all of the levels together. In an embodiment, the program component in the memory device can perform all levels program operation, which includes a first phase and a second phase. In the first phase, an increasing or ramping wordline voltage (e.g., a voltage applied to one or more wordlines that is periodically ramped or increased by a step voltage amount) is applied to a set of wordlines of the memory array (e.g., the selected wordline and one or more unselected wordlines). In an embodiment, during the first phase, respective pillars (e.g., vertical conductive traces) corresponding to programming levels (e.g., L1 to L6 for a TLC memory device) are floated (e.g., disconnected from both a voltage supply and a ground). In an embodiment, a set of pillars corresponding to different programming levels are floated in sequence during the first phase (e.g., a first pillar corresponding to L1 is floated at a first time, a second pillar corresponding to L2 is floated at a second time, and so on). In an embodiment, once a pillar is floated, a voltage of each pillar can be boosted or increased in accordance with a step or increase of the ramping wordline voltage. At the end of the first phase, the pillar voltage levels (Vpillar) are boosted to different voltage levels (e.g., Vpillar for programming level L1 is boosted to a highest value, Vpillar for programming level L2 is boosted to a next highest value and so on, where Vpillar for programming level L0 remains 0V during the first phase).

In the second phase, a programming pulse is applied to the selected wordline to program all of the programming levels (e.g., L1 to L7 for a TLC memory device). In an embodiment, the first phase and the second phase can be iteratively performed until the programming of all of the programming levels has been verified. In an embodiment, each iteration of the second phase of the programming operation includes the application of a programming pulse, wherein each programming pulse programs all of the programming levels together. For each programming pulse of the set of programming pulses, a program verify operation can be performed for each programming level to verify that target voltage corresponding to each respective programming level has been reached. This results in a significant reduction in the number of programming pulses that is needed to program all of the levels of the target wordline.

After performing all levels program (ALP) operation, the program component can perform a corrective program verify (CPV) operation to verify whether a target wordline (WLn) is programmed to a target programming level (e.g., L1, L2 . . . L15 for a QLC memory device). The corrective program verify operation uses the programming level information of immediately subsequent neighbor wordline (WLn+1) to adjust the program verify voltage (Vpv) applied to the target wordline (WLn). Specifically, during the corrective program verify operation, the program verify voltage (Vpv) is applied to the target wordline (WLn) to verify the programming state (e.g., whether the target wordline has reached the target programming level), and the program verify voltage (Vpv) applied to the target wordline may be specifically determined to compensate for cell-to-cell (C2C) coupling with achieving a desired RWB increase. For example, the program verify voltage (Vpv) may be adjusted by an offset voltage amount (herein referred to as the "PV voltage offset"). The PV voltage offset may be determined based on the programming level information of immediately subsequent neighbor wordline (WLn+1). The PV voltage offset is specific to the programming level of the target wordline (WLn). For easy illustration, a target memory cell connected to a target wordline (WLn) can be referred to as a victim memory cell, while a memory cell can be referred to as an aggressor memory cell if the memory cell is connected to immediately subsequent neighbor wordline (WLn+1) and the programming level of the memory cell affects a threshold voltage of the victim memory cell. The programming level information of immediately subsequent neighbor wordline (WLn+1) may depend on the number of bits of information reflecting a threshold voltage of one or more aggressor memory cells of the immediately subsequent neighbor wordline (WLn+1) and be categorized as described below.

In an illustrative example, the target memory cell may be a TLC type of cell, which can be programmed to programming levels L0-L7. For each programming level, a respective PV voltage offset is determined based on the programming level of aggressor memory cell. For example, in a situation where programming level information of 1-bit aggressor memory cell is used, the programming levels of the aggressor memory cell can be categorized as high or low programming level (e.g., C1, C2) since those two categorizations can be represented with a single binary bit. In this example, the program component can determine that the effects of the aggressor memory cell programmed to the low programming level C1 may not need to be compensated and can use the default PV voltage to program the target memory cell (or may need to use a PV voltage offset (e.g., Xn mV) less than the default PV voltage); and the program component can determine that the PV voltage used to compensate for the effect of the target memory cells caused by the aggressor memory cells programmed to the high programming level C2 may need a PV voltage offset (e.g., Yn mV) less than the default PV voltage used regardless of the programming level to which the target memory cell is being programmed. Using the above example, for programming level L1 of the target memory cell, when the aggressor memory cell is to be programmed to the low programming level C1, PV voltage offset X1 is used, and when the aggressor memory cell is to be programmed to the high programming level C2, PV voltage offset Y1 is used; for programming level L2 of the target memory cell, when the aggressor memory cell is to be programmed to the low programming level C1, PV voltage offset X2 is used, and when the aggressor memory cell is to be programmed to the high programming level C2, PV voltage offset Y2 is used; and so on. As such, for each programming level of the target memory cell, for each categorized programming level (e.g., based on the 1-bit programming level (e.g., low programming level C1 or high programming level C2)) of the aggressor memory cell, a respective PV voltage offset is used. Similarly, for each programming level of the target memory cell, in a situation where programming level information of 2-bit aggressor memory cell is used, the programming levels of the aggressor memory cell can be categorized to either be four categorized programming level (e.g., C1, C2, C3, C4), for each categorized programming level of the aggressor memory cell, a respective PV voltage offset is used.

In an embodiment, the PV voltage offset may be determined via a look-up of a stored or predetermined value corresponding to a programming level of the target wordline (WLn) and a categorized programming level of the immediately subsequent neighbor wordline (WLn+1).

In an embodiment, instead of providing respective PV voltage offset to each programming level of the target memory cell, certain programming levels of the target memory cell can be grouped such that they can use the same PV voltage offsets. For example, the program component can initially group the programming levels of the target memory cell into one group, which means that regardless of the programming level to which the target memory cell is being programmed, the same PV voltage offsets are used. In some implementations, having grouped the programming levels into one group, the program component can cycle through a pre-determined set of potential PV voltage offset values until the value that maximizes the RWB increase is found. Further, the value that results in the greatest RWB increase for the grouping can be compared to the maximum RWB increase (i.e., the RWB increase resulting from perfect compensation e.g., as calculated by using the Law of Total Variance, to determine the reduction of the spread of the Vt distribution for a particular programming level) to determine whether the target RWB increase is achieved. If the greatest RWB increase that can be obtained using the chosen grouping of the specified cell programming levels is not equal to or greater than the target RWB increase, the program component can divide the programming levels into more groups.

Continuing using illustrative example described above, the program component can group the programming levels of the target memory cell into two groups. For example, programming levels L0-L3 can be grouped as a first group and programming levels L4-L7 can be grouped as a second group. For example, in a situation where programming level information of 1-bit aggressor memory cell is used, for each programming level in the first group (i.e., L0-L3), when the aggressor memory cell is to be programmed to the low programming level C1, PV voltage offset X3 is used, and when the aggressor memory cell is to be programmed to the high programming level C2, PV voltage offset Y3 is used. For each programming level in the second group (i.e., L4-L7), when the aggressor memory cell is to be programmed to the low programming level C1, PV voltage offset X4 is used, and when the aggressor memory cell is to be programmed to the high programming level C2, PV voltage offset Y4 is used.

This new program scheme can be used in various logical wordline sequence writing, including source to drain or drain to source. This new program scheme can be used with various cell types, including MLC, TLC, QLC, PLC, etc. This new program scheme can be used by system normal block usage, partial good block usage or potential block-by-deck (BBD) usage. This new program scheme may be used for other types of vertical non-volatile memory device, including resistive random-access memory (ReRAM), phase-change random-access memory (PCRAM), etc.

Advantages of the present disclosure include improved performance in the memory sub-system. The reduction in the number of required program pulses to program all of the levels results in a reduction of programming time, less energy per bit, and a reduction in peak wordline current. In addition, in an embodiment, corrective program verify operations are performed for each program pulse and each programming levels, therefore no program verify skipping is needed, thereby simplifying the control of the memory sub-system and achieving verified target programming levels. Accordingly, the overall quality of service level provided by the memory sub-system is improved.

Advantages of the present disclosure also include mitigating the effects of C2C coupling and LM by utilizing less than perfect compensation. For example, the lower increase in RWB allows the use of fewer PV voltage offsets (e.g., corresponding to respective programming level groups) to result in the desired RWB gain. Thus, although in some of the embodiments the RWB increase can be lower than the maximum possible RWB increase achieved from perfect compensation, it is sufficient to achieve a desired improvement in performance (e.g., reduced BER). The several embodiments include components that conserve computing time and resources that would otherwise be wasted for achieving perfect compensation. Moreover, the embodiments may require less memory space to store the parameters used to offset the PV voltages of the corrective programming operations. Accordingly, aspects of the present disclosure improve the efficiency of remedial modifications to memory access operations that compensate for C2C coupling and LM effects by reducing the resources, time, and energy used to reach the desired RWB increase.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory page buffers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program component 134 configured to carry out corresponding memory access operations, in response to receiving the memory access commands from memory interface 113 and implement all levels program operation integrated with corrective program verify operation in the memory device 130. In some embodiments, local media controller 135 includes at least a portion of program component 134 and is configured to perform the functionality described herein. In some embodiments, program component 134 is implemented on memory device 130 using firmware, hardware components, or a combination of the above. In one embodiment, program component 134 receives, from a requestor, such as memory interface 113, a request to program data to a memory array of memory device 130. The memory array can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, program component 134 can receive data to be programmed to the memory device 130 (e.g., a TLC memory device). Accordingly, program component 134 can execute an all levels program operation to program each memory cell to one of 8 possible programming levels (i.e., voltages representing the 8 different values of those three bits). In one embodiment, program component 134 can program memory cells in the TLC portion of the memory array to all of the multiple respective programming levels (e.g., programming levels L0, L1, L2 . . . L7), wherein each programming pulse programs all of the programming levels from L1 to L7. For example, upon identifying a set of memory cells to be programmed (e.g., the memory cells associated with one or more wordlines of the memory array), program component 134 can execute a first phase of all levels program operation wherein a ramping wordline voltage is applied and each pillar corresponding to the respective programming levels is floated. In an embodiment, a voltage of each pillar (Vpillar) when floated can be boosted using the ramping wordline voltage.

In an embodiment, the program component 134 can execute a second phase of all levels program operation to cause a single program pulse (e.g., a set of programming pulses) to be applied to the identified set of memory cells to program those memory cells to each of the multiple respective programming levels (i.e., L1, L2, . . . L7). In an embodiment, the program component 134 can perform a program verify operation corresponding to each programming pulse and programming level to verify whether the memory cells in the set were programmed to all of the respective programming levels. The program component 134 can execute the first phase and the second phase (wherein each iteration of the second phase includes the application of programming pulse) until all of the programming levels have reached the corresponding target program voltage level. Further details with regards to the operations of program component 134 are described below.

In an embodiment, the program component 134 can perform corrective program verify operations using a program verify voltage offset to establish a program verify voltage applied to a target wordline (WLn) to improve read window budget and data retention loss. For example, the program component 134 an initiate a corrective program verify operation to verify programming of a set of target cells connected to a target wordline, identify a program verify voltage offset associated with the target wordline based on the programming level information of the immediately subsequent neighbor wordline, and cause, during a program verify operation of the program operation, a program verify voltage to be applied to the target wordline, where the program verify voltage is a default program verify voltage adjusted by the program verify offset. Further details regarding implementing all levels program operation integrated with corrective program verify operation will be described in further detail below with reference to FIGS. 2A-10.

Figure 1B:
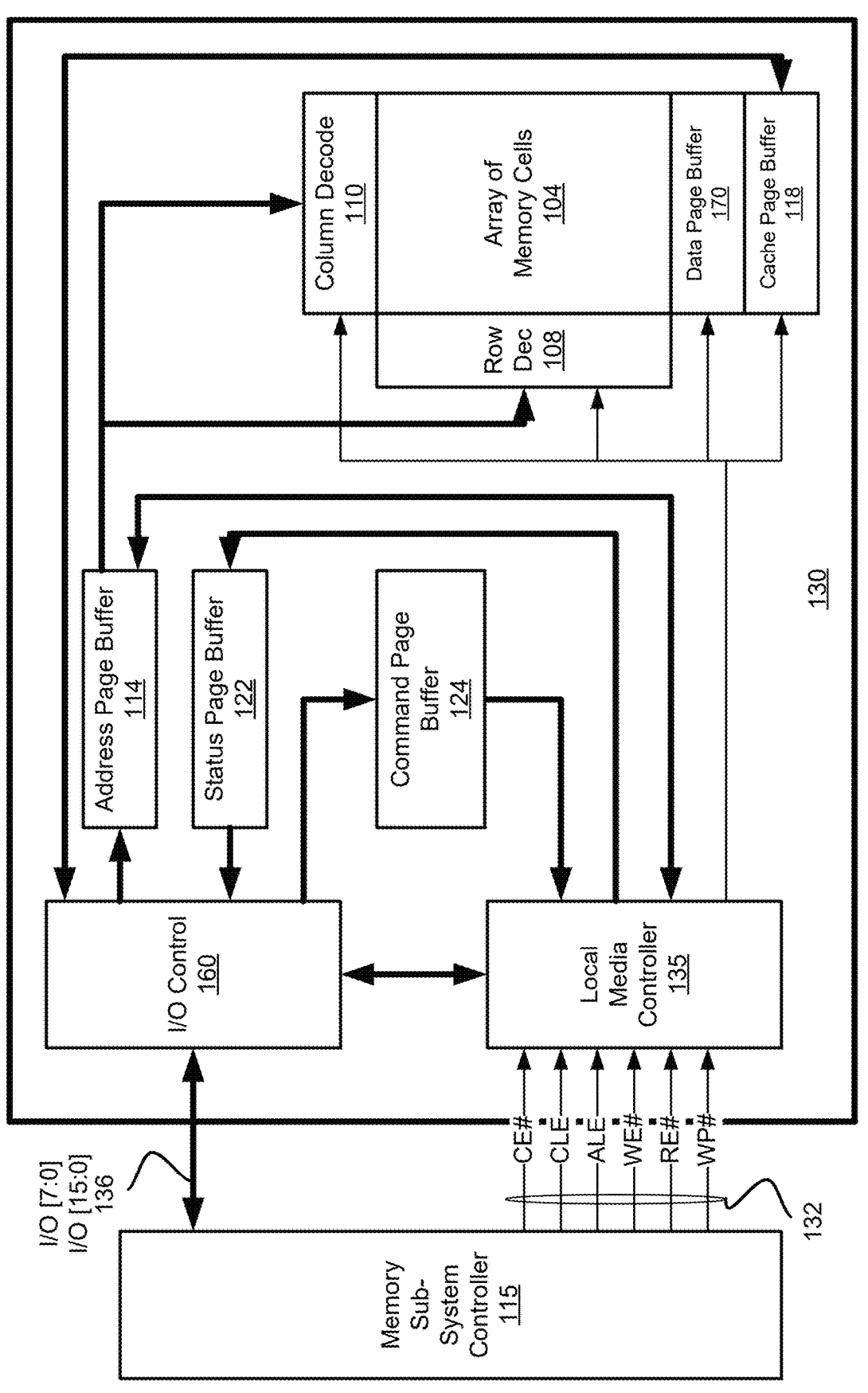
FIG. 1B is a block diagram of a memory device in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 110 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address page buffer 114 is in communication with I/O control circuitry 160 and row decode circuitry 108 and column decode circuitry 110 to latch the address signals prior to decoding. A command page buffer 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 110 to control the row decode circuitry 108 and column decode circuitry 110 in response to the addresses. In one embodiment, local media controller 135 includes the program component 134, which can implement all levels program operation integrated with corrective program verify operation on memory device 130.

The local media controller 135 is also in communication with a cache page buffer 118. Cache page buffer 118 latches data, either incoming or outgoing, as directed by the local media controller 135 to temporarily store data while the array of memory cells 104 is busy writing or reading, respectively, other data. During a program operation (e.g., write operation), data may be passed from the cache page buffer 118 to the data page buffer 170 for transfer to the array of memory cells 104; then new data may be latched in the cache page buffer 118 from the I/O control circuitry 160. During a read operation, data may be passed from the cache page buffer 118 to the I/O control circuitry 160 for output to the memory sub-system controller 115; then new data may be passed from the data page buffer 170 to the cache page buffer 118. The cache page buffer 118 and/or the data page buffer 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status page buffer 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command page buffer 124. The addresses may be received over input/output (I/O) pins [7:0] of I/O bus 136 at I/O control circuitry 160 and may then be written into address page buffer 114. The data may be received over input/output (I/O) pins [7:0] for an 8-bit device or input/output (I/O) pins [15:0] for a 16-bit device at I/O control circuitry 160 and then may be written into cache page buffer 118. The data may be subsequently written into data page buffer 170 for programming the array of memory cells 104.

In an embodiment, cache page buffer 118 may be omitted, and the data may be written directly into data page buffer 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS.

1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
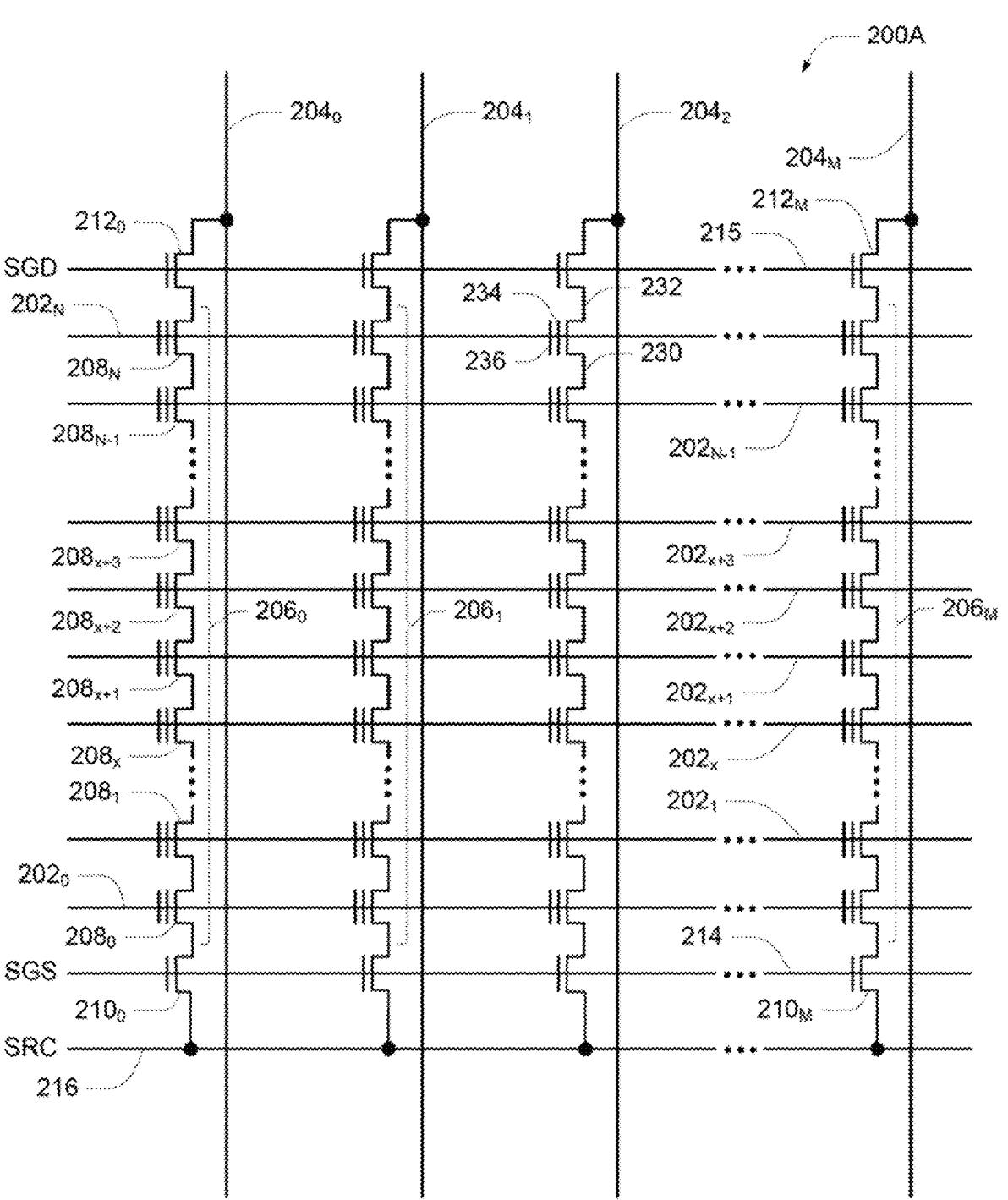
FIG. 2A-2B are schematics of portions of an array of memory cells as could be used in a memory of the type described with reference to FIG. 1B, in accordance with one or more embodiments of the present disclosure.
Figure 2B:
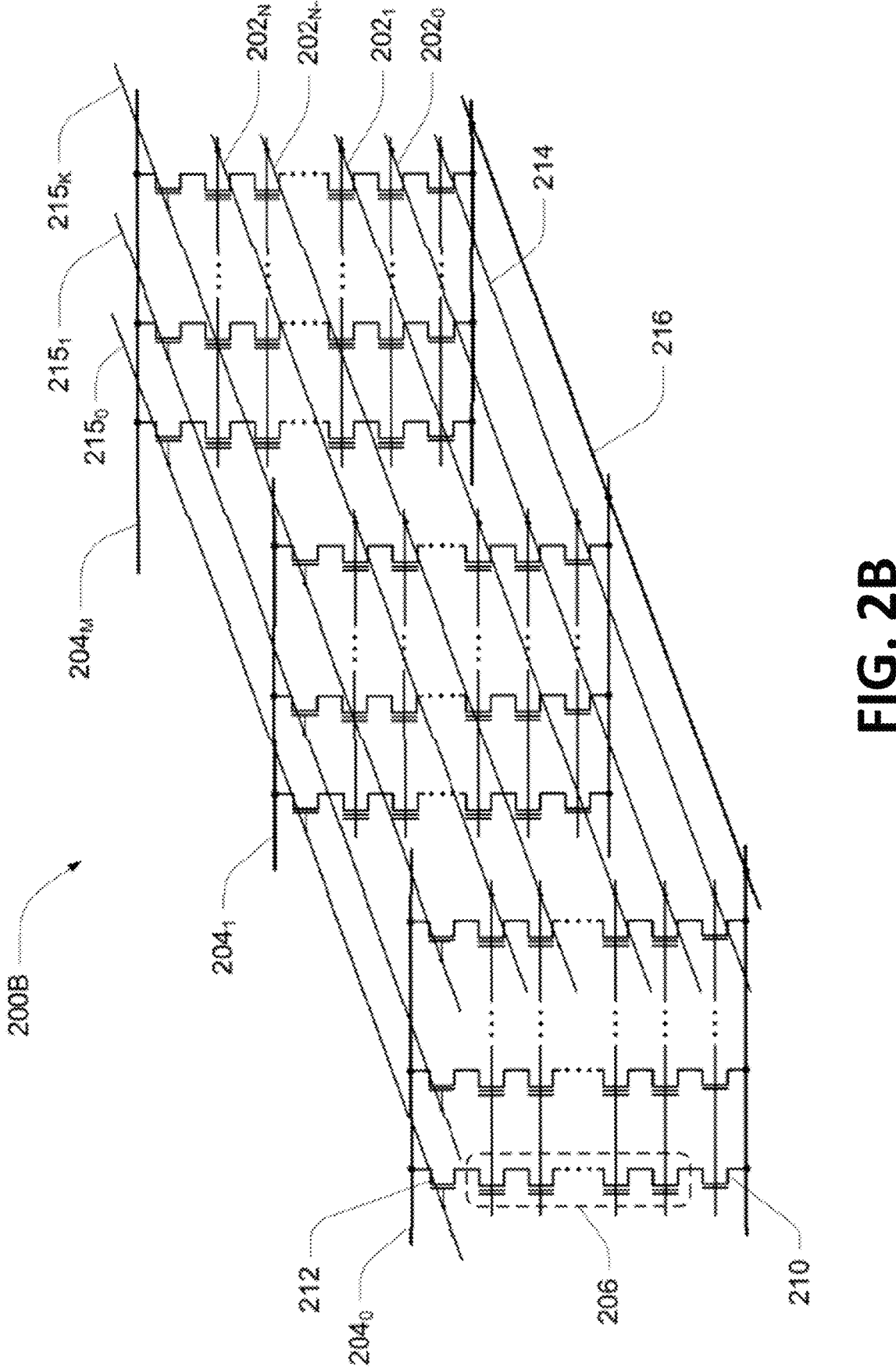

FIGS. 2A-2B are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines 2020 to 202N, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline 202N and selectively connected to even bitlines 204 (e.g., bitlines 2040, 2042, 2044, etc.) may be one physical page of memory cells 208 (e.g., even memory cells) while memory cells 208 commonly connected to wordline 202N and selectively connected to odd bitlines 204 (e.g., bitlines 2041, 2043, 2045, etc.) may be another physical page of memory cells 208 (e.g., odd memory cells). Although bitlines 2043-2045 are not explicitly depicted in FIG. 2A, it is apparent from the figure that the bitlines 204 of the array of memory cells 200A may be numbered consecutively from bitline 2040 to bitline 204M. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines 2020-202N (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings 2060 to 206M. Each string 206 can be connected (e.g., selectively connected) to a source line 216 (SRC) and can include memory cells 2080 to 208N. The memory cells 208 of each string 206 can be connected in series between a select gate 210, such as one of the select gates 2100 to 210M, and a select gate 212, such as one of the select gates 2120 to 212M. In some embodiments, the select gates 2100 to 210M are source-side select gates (SGS) and the select gates 2120 to 212M are drain-side select gates. Select gates 2100 to 210M can be connected to a select line 214 (e.g., source-side select line) and select gates 2120 to 212M can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell 2080 of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell 208N of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line 2040-204M by a select gate 212 and to the SRC 216 by a select gate 210. Multiple strings 206 can be selectively connected to the same bitline 204. Subsets of strings 206 can be connected to their respective bitlines 204 by biasing the select lines 2150-215L to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 3 is a flow diagram of an example method 300 of all levels program operation integrated with corrective program verify operation in a memory device in a memory subsystem in accordance with some embodiments of the present disclosure. The method 300 will be described with reference to FIGS. 4-9, and specifically, the operations 320-340 may be illustrated with respect to FIGS. 4-6 regarding all levels program operations, and the operations 350-360 may be illustrated with respect to FIGS. 7A-9 regarding corrective program verify operation. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by program component 134 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device may identify a set of memory cells to be programmed. In some implementations, the processing device (e.g., program component 134) can receive, from a requestor, such as a memory interface 113 of a memory sub-system controller 115, a request to perform a memory access operation on a memory array, such as memory array 200A, of a memory device, such as memory device 130. In some implementations, the memory access operation comprises a program operation to program the set of memory cells to a set of programming levels (e.g., L1 to L7; wherein L0 is an erase state). In some implementations, the program operation is directed to one or more specific memory cell addresses. In some implementations, the processing device can identify the set of memory cells (e.g., a subset of the memory cells of memory array 200A of FIG. 2A or memory array 404 of FIG. 4, such as those memory cells associated with a certain wordline or multiple wordlines of memory array). In some implementations, the set of memory cells are configured as any type of memory cells, such as MLC, TLC, or QLC memory cells (e.g., any type of memory cells that store more than one bit per cell including 2 bits, 3 bits, 4 bits, or more bits per cell). In some implementations, the identified set of memory cells are to be programmed to multiple programming levels (e.g., L1, L2 . . . L7 for a TLC memory device). In some implementations, the request includes a set of physical or logical addresses corresponding to the set of memory cells to be programmed. In some implementations, the processing device identifies the set of memory cells based on the set of addresses provided as part of the request. In some implementations, the processing device can cause the program operation to be initiated to program the set of target memory cells of a target wordline (WLn) to a target programming level (e.g., L1, L2, L3 . . . or L15 of a QLC memory device). The request can be a program command received via a memory sub-system controller (e.g., the memory sub-system controller 115). Each target memory cell of the set of target memory cells is connected to the target wordline.

In some implementations, if the memory sub-system controller performs an operating of migrating data from SLC cache to TLC memory device, the processing device may receive a read command that includes the data pattern for subsequent neighbor wordline (WLn+1) and determine the group for target wordline (WLn).

In some implementations, if the memory sub-system controller performs a write operation by allocating large SRAM, the processing device may need to distinguish the group for target wordline (WLn) based on neighbor wordline's data.

At operation 320, the processing device may cause a ramping wordline voltage to be applied to one or more wordlines of the memory array (e.g., ramping wordline voltage applied to target wordline 601, as described in detail below with reference to FIG. 6). In some implementations, upon identifying a set of memory cells to be programmed (e.g., the memory cells associated with one or more wordlines of a memory array identified in operation 310), the processing device may, during the first phase of all levels program operation, cause an increasing or ramping wordline voltage (e.g., a voltage applied to one or more wordlines that is periodically ramped or increased by a wordline step voltage) to be applied to a set of wordlines of the memory array (e.g., including a selected wordline corresponding to the set of identified memory cells to be programmed and one or more unselected wordlines).

As the ramping wordline voltage is applied to the set of wordlines (in operation 320), the set of pillars are floated in sequence. In some implementations, the pillars refer to the channel regions (e.g., composed of polysilicon) of the access transistors of a vertical string of memory cells. In some implementations, by floating each pillar associated with a respective programming level at different times in operation 330, each pillar is exposed to a different length of the wordline voltage ramp process while in the floating state. In some implementations, as a result each pillar is boosted to a different voltage as a function of the different exposure times associated with the ramping wordline voltage. For example, a first pillar that is floated first in sequence is exposed to a longest relative length of time of the wordline voltage and, as such, is boosted to a highest voltage level, a second pillar that is floated second in sequence is exposed to a next longest relative length of time of the wordline voltage and, as such, is boosted to a next highest voltage level, and so on.

For example, at operation 330, the processing device may, during the first phase of all levels program operation, cause a disconnection of a set of pillars associated with the set of memory cells from a voltage supply and ground voltage (i.e., ground), wherein each pillar corresponds to a programming level of a set of programming levels (e.g., L1 to L7 for a TLC memory device). In some implementations, during the first phase of all levels program operation, respective pillars (e.g., vertical conductive traces of the memory array) corresponding to programming levels (e.g., L1 to L6 for a TLC memory device) are floated (e.g., disconnected from both a voltage supply and a ground). In some implementations, the set of pillars corresponding to different programming levels are floated in sequence during the first phase of all levels program operation (e.g., a first pillar corresponding to L1 is floated at a first time, a second pillar corresponding to L2 is floated at a second time, and so on).

In some implementations, the pillars are floated by turning a corresponding source-side select transistor (SGD) and a corresponding drain-side select transistor (SGS) off. In some implementations, a pillar can be floated by turning both a select gate source (SGS) off and select gate drain (SGD) off (e.g., a selected SGD is toggled from a high voltage level (e.g., $V_{sgd\_high}$) to approximately 0V to prevent a corresponding bitline from discharging to the corresponding pillar). In an embodiment, a bitline corresponding to the first pillar associated with the programming level L1 is toggled from approximately 0V to a high voltage level (e.g., $V_{BL\_high}$) to ensure the pillar remains floating during the remainder of the first phase (e.g., application of the ramping wordline voltage).

In an embodiment, once floated, a voltage of each pillar (Vpillar) can be periodically boosted or increased in accordance with each step or increase of the ramping wordline voltage (e.g., each step of the ramping wordline voltage increases or boosts the pillar voltage for a pillar that is floating). At the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains approximately 0V during the first phase).

Figure 4:
FIG. 4 illustrates an example program operation including multiple pulses used for all levels program operation in a memory device in a memory sub-system in accordance with one or more embodiments of the present disclosure.

FIG. 4 illustrates an example set of pillars in a memory array 404 that are placed in a floating state in accordance with operations 320-330 of FIG. 3. As shown in FIG. 4, the example memory array 404 of a TLC memory device includes wordlines (e.g., a target wordline (WLn), a first set of unselected wordlines (e.g., WLn−1 and WLn+1 to WLn+x), a second set of unselected wordlines (e.g., WLn−2 to WLn−y) and a set of bitlines (e.g., $BL_0$ to $BL_7$) corresponding to an erase level (L0) and multiple programming levels (L1, . . . L7) to be programmed according to an all levels program operation in accordance with one or more embodiments of the present disclosure. As shown in FIG. 4, the memory array 404 may be arranged in rows (each corresponding to a wordline) and columns (each corresponding to a bitline), wherein the intersection of a wordline and bitline constitutes the address of the memory cell. Each column may include a string of series-connected memory cells connected (e.g., selectively connected) to a common source (SRC). The common source can be coupled to a reference voltage (e.g., ground voltage or simply "ground" (Gnd) or a voltage source (e.g., a charge pump circuit or power supply which may be selectively configured to a particular voltage suitable for optimizing a programming operation, for example). A string of memory cells may be connected in series between a first select transistor (e.g., a source-side select transistor) referred to as a source select gate (SGS) and a second select transistor (e.g., a drain-side select transistor) referred to as a drain select gate (SGD). The source select transistors may be commonly connected to a first select line (e.g., a source select line) and the drain select transistors may be commonly connected to a second select line (e.g., a drain select line).

As shown in FIG. 4, the memory array 404 includes a set of pillars (e.g., Pillar0, Pillar1 . . . Pillar7) corresponding to substantially vertical strings of series coupled memory cells of the memory array 404. In an embodiment, the pillars refer to the channel regions (e.g., composed of polysilicon) of the access transistors of a vertical string of memory cells. In an embodiment, the channel region is first discharged to ground before being floated and boosted to a particular voltage (e.g., as described in connection with operations 320-330 of FIG. 3). As shown in FIG. 4, each of the pillars are floated and a corresponding voltage is boosted at different voltage levels (Vpillar) at different times (e.g., during operations 320-330 of FIG. 3) by turning the source-side select transistor (SGS) and the drain-side select transistor (SGD) off. In an embodiment, once a respective pillar is floated, a voltage of each pillar (Vpillar) can be boosted or increased in accordance with a step or increase of the ramping wordline voltage. At the end of the first phase, the pillar voltage levels (Vpillar) are boosted to different voltage levels (e.g., Vpillar for programming level L1 is boosted to a highest value, Vpillar for programming level L2 is boosted to a next highest value and so on to Vpillar for programming level L0 which remains approximately 0V during the first phase).

In an embodiment, as the ramping wordline voltage is applied, each of the pillars of a set of pillars (e.g., Pillar1 to Pillar6 in FIG. 4) are floated in sequence. In an embodiment, a voltage of the pillar corresponding to the erase state (Pillar0) is floated prior to the application of the ramping wordline voltage. For example, Pillar 1 is floated at a first time during application of the ramping wordline voltage, Pillar 2 is floated at a second time during application of the ramping wordline voltage, and so on.

In an embodiment, while a respective pillar is in the floated state, a voltage corresponding to that pillar is boosted by the ramping wordline voltage. For example, Pillar 1 is floated at a first time and is boosted to a pillar voltage level corresponding to each increase of the ramping wordline voltage (e.g., each time the ramping wordline voltage is stepped). In this example, since Pillar 1 is floated at a first time, the corresponding pillar voltage (e.g., Vpillar1) is boosted multiple times in accordance with each increase of the ramping wordline voltage until the end of the wordline ramping phase (e.g., the first phase) of all levels program operation.

In an embodiment, as shown in FIG. 4, since the pillars are floated in sequence (e.g., Pillar1 is floated before Pillar2, Pillar2 is floated before Pillar3, and so on), the respective pillar voltages are boosted from higher levels to lower levels moving from left to right in FIG. 4. In this regard, Vpillar1 is higher than Vpillar2, Vpillar2 is higher than Vpillar3, and so on as a function of the time when each pillar is floated. In an embodiment, the Vpillar for a floated pillar is boosted to a higher voltage level each time the ramping wordline voltage increases. As such, pillars that are floated earlier are boosted by a greater number of wordline ramping increases.

FIG. 4 illustrates the selected wordline (WLn) to which the set of programming pulses are applied. In an embodiment, a first set of unselected wordlines including WLn−1 and WLn+1 through WLn+x, as shown in FIG. 4, are ramped to a pass voltage (Vpass) for programming levels L1 to L7 (e.g., WLn+1 and above are ramped in seven levels to Vpass for fine tuning the corresponding pillar potential). In an embodiment, the pillar potential may stay on approximately 0V through a conduction with corresponding bitline for L7 program or be inhibited on any of the seven voltages (e.g., between 0V and Vpass) for L0~L6 program, depending on user data levels. In an embodiment, a second set of unselected wordlines including WLn−2 through WLn−y are set to 0V (e.g., SGS~0V, SGD~0V).

Referring back to FIG. 3, at operation 340, the processing device may, during the second phase of all levels program operation, cause a programming pulse to be applied to the set of memory cells (e.g., the set of memory cells of memory array 204 of FIG. 2 or memory array 404 of FIG. 4), wherein the programming pulse programs all programming levels associated with the identified set of memory cells. In some implementations, the programming pulse can be applied to the one or more target wordlines associated with the set of memory cells to be programmed (e.g., the set of memory cells identified in operation 310), wherein the programming pulse programs each of the programming levels together (e.g., programming levels L1 to L7 are programmed using the programming pulses). In some implementations, the boosting of the pillar voltages during a first phase enables the programming of all of the programming levels together using each programming pulse, the memory cells of the respective programming levels can be raised to the corresponding target voltage level in quicker and more efficient manner.

Figure 5:
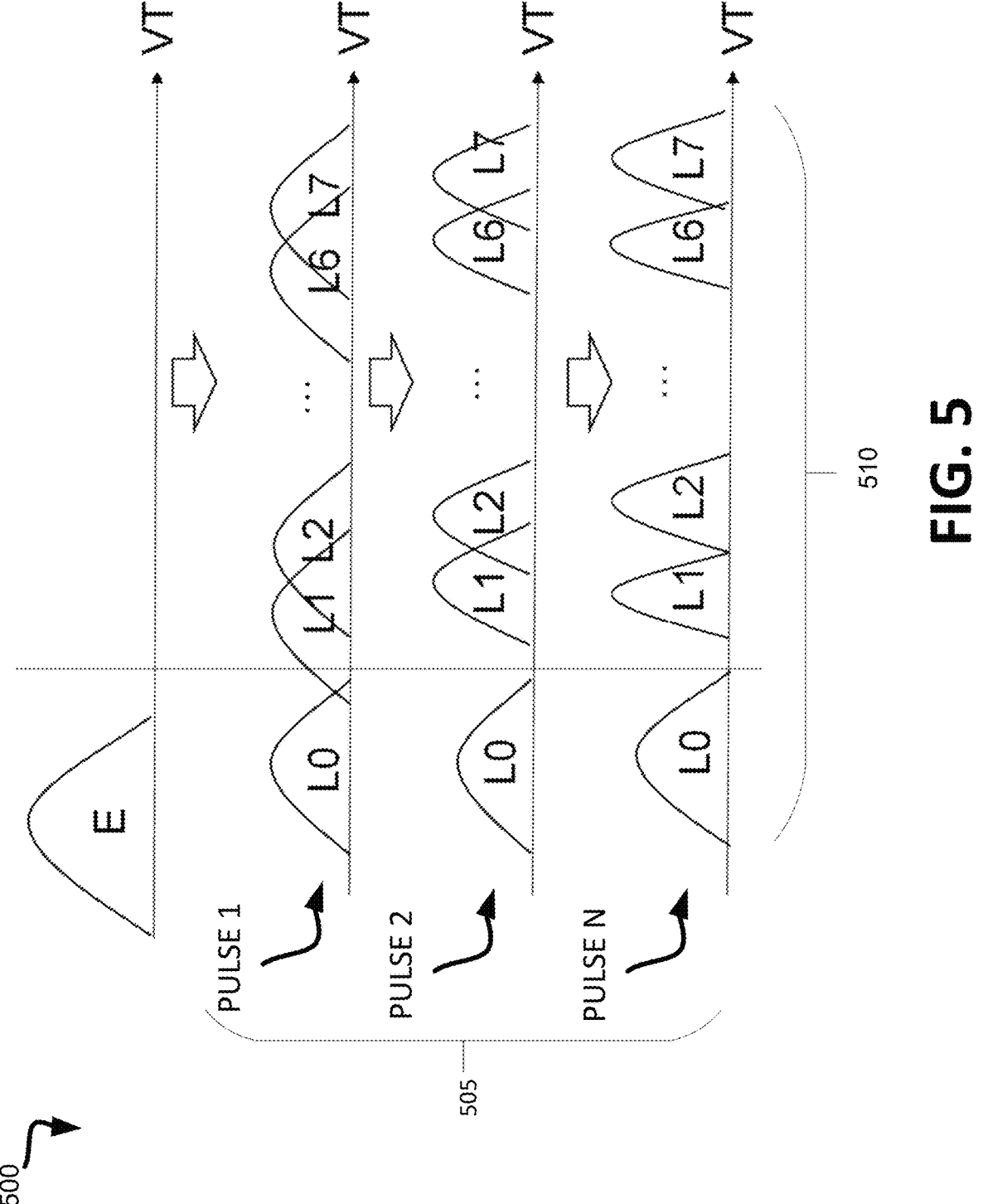
FIG. 5 illustrates an example memory array including wordlines and bitlines corresponding to multiple programming levels to be programmed according to an all levels program operation in accordance with one or more embodiments of the present disclosure.
Figure 6:
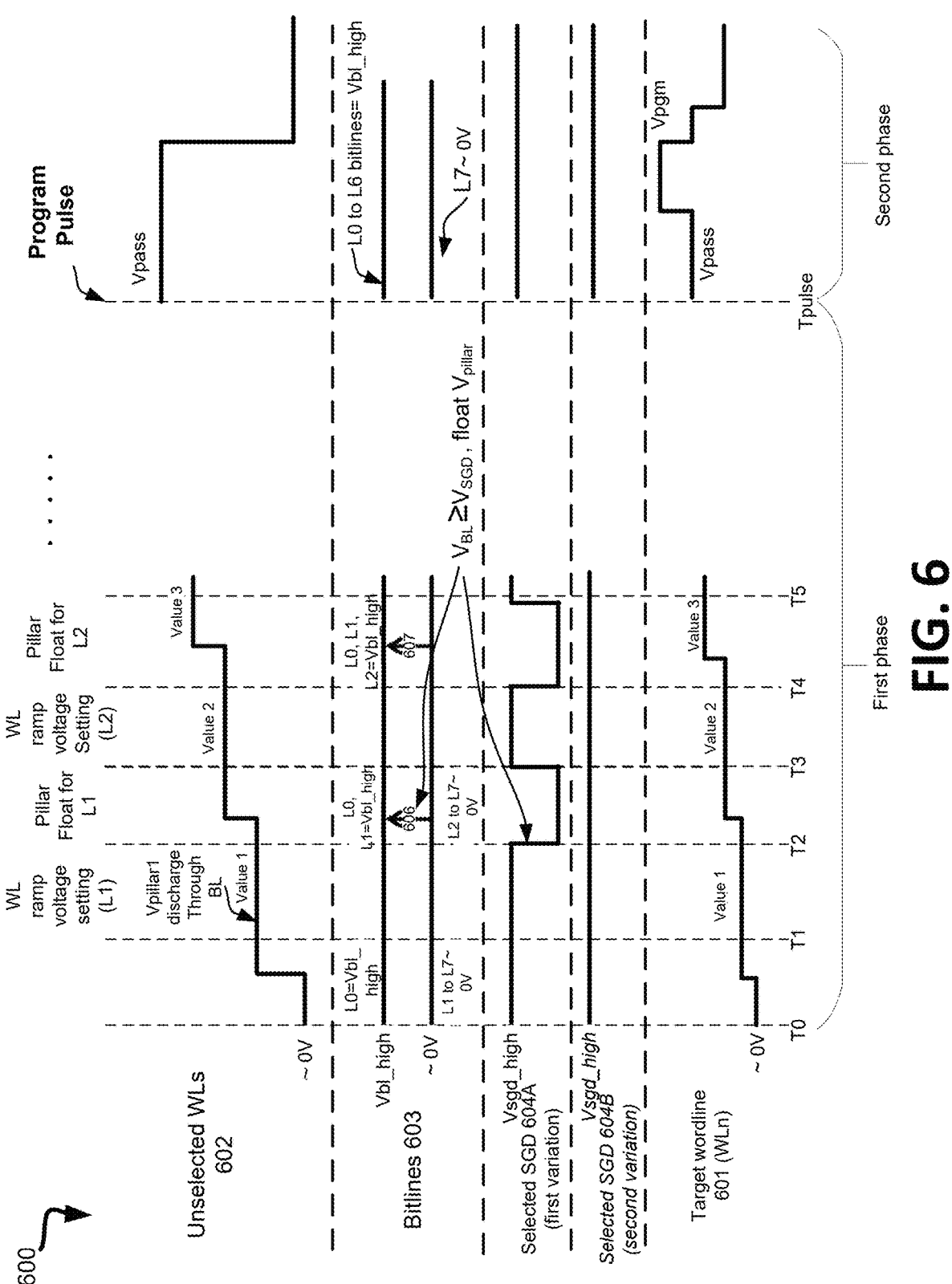
FIG. 6 illustrates example program pulse waveforms corresponding to all levels program operation in a memory device in a memory sub-system in accordance with one or more embodiments of the present disclosure.

In some implementations, operations 320-340 can be iteratively executed (e.g., phase 1 and phase 2 shown in FIG. 6 are iteratively performed), wherein each execution of operation 340 includes the application of a single programming pulse until each of the programming levels reach the corresponding target voltage level. For example, operations 320-340 can be iteratively performed to enable the execution of pulse 1, pulse 2 . . . pulse N of FIG. 5 until all of the programming levels (e.g., L1 to L7) have been programmed. For each pulse of the set of pulses, a program verify operation can be performed for each programming level to verify that target voltage corresponding to each respective programming level has been reached. In an example, all levels program operation can include a set of pulses (e.g., six pulses) to program seven programming levels, results in the application of forty-two program verify operations).

FIG. 5 illustrates an example programming operation including a set of multiple pulses 505 (e.g., pulse 1, pulse 2 . . . pulse N) applied to program all programming levels (e.g., L1, L2, . . . L7) of the identified set of memory cells of the memory array, according to embodiments of the present disclosure. As shown in FIG. 5, each respective pulse (e.g., Pulse 1, Pulse 2 . . . and Pulse N) is used to program each of programming levels (e.g., L1 to L7) of a memory device in a memory sub-system in accordance with one or more embodiments of the present disclosure. In an embodiment, each pulse programs an entire set of program levels 510 (e.g., all levels) of the memory cells together. In an embodiment, the set of pulses 505 are applied to a target wordline (e.g., WLn) associated with the set of memory cells to be programmed, as shown and described with reference to FIG. 6.

FIG. 6 illustrates example voltage waveforms of various portions of a memory array during execution of all-level program operations (e.g., the operations 320-340 of method 300 of FIG. 3). In an embodiment, the portions of the memory array include a set of memory cells associated with a target wordline 601 (WLn) and portions of corresponding voltage waveforms resulting from execution of an all levels program operation (such as the operations of method 300, described above), according to embodiments of the present disclosure. In an embodiment, the processing logic identifies a set of memory cells to be programmed by an all levels program operation (e.g., target wordline 601 (WLn)) (e.g., operation 310 of method 300, described above) In an embodiment, the all levels program operation includes a first phase (starting from time T0) wherein a ramping wordline voltage is applied (e.g., operation 320) to a set of wordlines (e.g., target wordline 601 and a set of one or more unselected wordlines 602). For example, as shown in FIG. 6, a ramping wordline voltage is applied to wordline 601 where the voltage is incrementally ramped from 0V to 3V between T0 and T5. While the ramping wordline voltage is applied, a set of pillars corresponding to different programming levels are sequentially floated (e.g., by uncoupling the set of pillars in operation 330). In an embodiment, a second set of unselected wordlines (e.g., WLn−2 and below) are set to 0V (e.g., the voltage of the source select gate (VSGS) is 0V, and the unsel_SGD=0V).

In an embodiment, prior to the first phase shown in FIG. 6 (e.g., prior to the application of the ramping wordline voltage), the pillar associated with the erase level (L0) is floated, a bitline 603 corresponding to L0 is set to $V_{BL\_high}$, and a selected SGD (Sel_SGD 604A, Sel_SGD 604B) is set to Vsgd_high. In an embodiment, the selected SGD can be toggled between Vsgd_high to a ground (e.g., approximately 0V), as shown with respect to a first waveform corresponding to Sel_SGD 604A. In accordance with another embodiment, the selected SGD can remain at Vsgd_high during the first phase, as shown with respect to a second waveform corresponding to Sel_SGD 604B. In an embodiment, the use of sel_SGD 604A (e.g., the toggling variation) is a first variation that can be implemented by the processing logic. In another embodiment, the use of Sel_SGD 604B (e.g., the variation wherein Sel_SGD 604B remains at Vsgd_high) is a second variation that can be implemented by the processing logic.

As shown in FIG. 6, between time T0 and T1, a first ramp of the ramping wordline voltage (e.g., from approximately 0V to value 1, in accordance with the step voltage) is applied. During a time between T1 and T2, the ramping wordline voltage is applied to a first pillar (e.g., Pillar1 of FIG. 4) corresponding to programming level L1. In an embodiment, during this time period, the voltage of Pillar1 (Vpillar1) is discharged through the bitline 603 corresponding to L1 which is set to ground (e.g., approximately 0V).

In an embodiment, a selected SGD 604A and the voltage levels of the bitlines 603 can be used to float the pillars in sequence and boost the corresponding pillar voltages (e.g., Vpillar) when each respective pillar is in the floating state. As shown in FIG. 6, during a first time period (e.g., T0 to T2), a voltage level applied to a selected SGD 604A ($V_{SGD}$) is a high source voltage level (Vsgd_high). In an embodiment, as shown in FIG. 6, at time T2, the selected SGD 604A can be toggled from Vsgd_high to ground (e.g., approximately 0V) in order to float the first pillar (e.g., Pillar1 of FIG. 4) corresponding programming level L1. As shown in FIG. 6, at time t2, the toggling of the selected SGD 604A from Vsgd_high to ground (e.g., approximately 0V) disconnects Pillar1 and floats the voltage of Pillar1 (Vpillar1) corresponding to programming level L1. In an embodiment, in response to or following the toggling of $V_{SGD}$ (e.g., toggling the selected SGD 604A), the L1 bitline is caused to toggle from ground (e.g., 0V) to a high voltage ($V_{BL\_high}$), as illustrated by the arrow 606. In an embodiment, the toggling of the L1 bitline to $V_{BL\_high}$ ensures Pillar1 is floated and Vpillar1 can be boosted in accordance with the wordline ramping level at the time of the floating. In an embodiment, Pillar1 is floated when the voltage of the bitline ($V_{BL}$) is greater than or equal to $V_{SGD}$).

In the example shown in FIG. 6, the Vpillar1 is boosted while Pillar1 is floated (e.g., in the floating state) and exposed to a longest relative duration of the application of the ramping wordline voltage to the target wordline, wherein the ramping wordline voltage is periodically increased or stepped by a wordline step voltage level. In this example, the Vpillar1 remains floating from T2 to the end of the first phase (e.g., in view of the setting of the corresponding bitline to $V_{BL\_high}$) and is repeatedly boosted by the ramping wordline voltage each time the ramping wordline voltage is ramped or increased. At the end of phase 1, Vpillar1 is boosted by the wordline step voltage (or a preset boost ratio of the wordline step voltage). For example, the Vpillar1 is boosted to value 7 (e.g., approximately 7V) after completion of the first phase (e.g., Vpillar1=[total ramping wordline voltage (e.g., approximately 8V)]−[the wordline voltage level at the time Vpillar1 is floated (e.g., 1V)]).

In an embodiment, as shown in FIG. 6, following the toggling of the selected SGD 604A (at time T2), and the corresponding increase of the L1 bitline voltage level from approximately 0V to $V_{BL\_high}$ (as illustrated by arrow 606), the bitline voltage level (e.g., $V_{BL}$) is greater than the $V_{SGD}$, resulting in Pillar1 remaining in a floating state and subject to boosting by the ramping wordline voltage until the end of the first stage As shown in FIG. 6, the floating of respective pillars continues for each of the set of pillars (e.g., pillars corresponding to L1 to L6) to enable each Vpillar to be boosted in accordance with the ramping wordline voltage. For example, at time T3, the selected SGD 604A is toggled from approximately 0V to Vsgd_high to enable the setting of the ramping wordline voltage in accordance with a next step or increase. It is noted that the SGD 604A is shared between the various strings and pillars such that the toggling of the SGD 604A from low to high (e.g., at time T3) does not affect Vpillar1 (e.g., the Vpillar for the pillars floated prior to the toggling of SGD 604A from low to high are not affected). As shown in FIG. 6, during a time period between T3 and T4 when the selected SGD 604A is Vsgd_high and $V_{BL2}$ is approximately 0V, value 2 of the ramping wordline voltage is applied. At time T4, Pillar2 is floated by toggling the selected SGD 604A from Vsgd_high to ground (e.g., approximately 0V). In an embodiment, following the toggling of the selected SGD 604A to Vsgd_high, the L2 bitline toggles from ground (e.g., approximately 0V) to $V_{BL\_high}$, as illustrated by the arrow 607. In an embodiment, the toggling of the L2 bitline to the inhibit voltage level maintains the floating of Pillar2 for the remainder of the first phase.

Although the portion of the waveforms shown in FIG. 6 relate to the floating of Pillar1 and Pillar2, the operations described in method 300 of FIG. 3 can be repeated as part of all levels program operation to float the pillars to move or adjust the corresponding Vpillar levels for each of the remaining programming levels (e.g., L3 to L6 for a TLC memory device). In an embodiment, as shown in FIG. 6, Pillar7 corresponding to programming level L7 is not floated due to the corresponding Vpillar being approximately 0V, as shown in FIG. 4. For example, at the end of the first phase, Vpillar1 is boosted to a first value (e.g., 7V), wherein Vpillar1=[total ramping wordline voltage (e.g., Vpass)]−[the wordline voltage level at the time Pillar1 is floated (e.g., value 1)], Vpillar2 is boosted to a second value (e.g., 6V), wherein Vpillar2=[total ramping wordline voltage (e.g., Vpass)]−[the wordline voltage level at the time Vpillar2 is floated (e.g., value 2)], Vpillar3 is boosted to a third value (e.g., 5V), wherein Vpillar3=[total ramping wordline voltage (e.g., Vpass)]−[the wordline voltage level at the time Vpillar3 is floated (e.g., value 3)], and so on. Accordingly, the boosted Vpillar is established for each respective pillar during the first stage, as shown in operation 330 of FIG. 3.

In an embodiment, at the end of the first phase (e.g., at Tpulse), the wordlines 601, 602 are ramped to a pass voltage level (Vpass). In an embodiment, the unselected wordlines are ramped in seven ramping levels to Vpass for fine tuning the Vpillar (e.g., pillar potential). At time Tn, different programming stress levels have been applied to corresponding programming level (Ln), as represented by the following expression: $V_{stresslevel(Ln)}$=Vpgm_WL−Vpillar, here Vpillar=(Vpass−Vwl_time_of_float)×boost_ratio; wherein Vwl_ time_of_float is the voltage level of the ramping wordline voltage at the time the pillar (Pillar_n) corresponding to the programming level (Ln) is floated; and wherein boost_ratio is a preset value (e.g., 1, 0.8, 0.6, etc.) corresponding to an amount of boost to the Vpillar as a function of the ramping wordline voltage.

In an embodiment, in accordance with the second variation noted above, the selected SGD 604B may be maintained at Vsgd_high. According to this variation, as shown in FIG. 6, the selected SGD 604B remains at Vsgd_high during the first phase of the programming operation (e.g., the selected SGD 604B is not toggled). According to this variation, with the selected SGD 604B remaining at Vsgd_high, the floating of each pillar is initiated by toggling the voltage (Vbl) of the bitline 603 corresponding to a respective pillar from approximately 0V to Vbl_high. For example, the L1 bitline can be toggled from ground (e.g., 0V) to a high voltage ($V_{BL\_high}$), as illustrated by the arrow 606, in order to float Pillar1. In an embodiment, the toggling of the L1 bitline to $V_{BL\_high}$ ensures Pillar1 is floated and Vpillar1 can be boosted in accordance with the wordline ramping level at the time of the floating, and repeatedly boosted each time the wordline ramping level increases.

As shown in FIG. 6, during the second phase of the programming operation, a first programming pulse is applied at time Tpulse. In an embodiment, the first programming pulse programs each of the programming levels (e.g., L1 to L7), in operation 340 of FIG. 3. In an embodiment, a programming voltage (Vpgm) of each pulse is applied to the selected wordline 601 to program each of the levels (L1 to L7 of a TLC memory device). In an embodiment, for the memory cells in a selected page, the same Vpgm_WL is applied on the second phase Vpgm. However, different Vpillars are setup during the first phase depending on the corresponding target data level. In an embodiment, the different $V_{stresslevels}$ are applied on the memory cells of L1 to L7. In an embodiment, a series of programming pulses (e.g., as shown in FIG. 5 as applied to the target wordline 601) to complete the programming of the set of programming levels. In an embodiment, for each pulse of the set of pulses applied during operation 340 of FIG. 3, a program verify operation can be performed for each programming level to verify that target voltage corresponding to each respective programming level has been reached.

Referring back to FIG. 3, at operation 350, the processing device may initiate a program verify operation. In some implementations, the program verify operation is a corrective program verify operation that uses the programming level information of immediately subsequent neighbor wordline (WLn+1) to adjust the program verify voltage (Vpv) applied to the target wordline (WLn). The detail of effect caused by a corrective program verify operation is illustrated below with respect to FIGS. 7A and 7B.

In some implementations, at operation 350, the processing device may identify, based on programming level information of the immediately subsequent neighbor wordline, a program verify (PV) voltage offset associated with the target wordline. In some implementations, the PV voltage offset is specific to the target programming level of the target memory cell(s). In some implementations, the programming level information of the immediately subsequent neighbor wordline comprises categorized programing levels of the immediately subsequent neighbor wordline (or aggressor memory cells) as described below. In some implementations, a magnitude of each respective PV voltage offset depends on the number of bits of information reflecting a threshold voltage (i.e., programming level) of one or more aggressor memory cells.

Figure 9A:
FIGS. 9A and 9B illustrate example data structures that store PV voltage offsets in accordance with one or more embodiments of the present disclosure.
Figure 9B:

In some implementations, the program verify (PV) voltage offset may be specifically determined such that the program verify voltage (Vpv) applied to the target wordline can compensate for cell-to-cell (C2C) coupling with achieving a desired RWB increase. In some implementations, the program verify voltage (Vpv) may be adjusted by an offset voltage amount (herein referred to as the "PV voltage offset"). The PV voltage offset may be determined based on the programming level of immediately subsequent neighbor wordline (WLn+1). In some implementations, the PV voltage offset is specific to the target programming level of the target wordline (WLn). In some implementations, the processing device may identify the PV voltage offset by performing a look-up operation of a data structure storing the preset PV voltage offset. In an embodiment, the PV voltage offset may be determined via a look-up of a stored or predetermined value corresponding to a programming level of the target wordline (WLn) and a categorized programming level of the immediately subsequent neighbor wordline (WLn+1). FIGS. 9A and 9B illustrate examples of data structures that store PV voltage offsets.

As shown in the example data structure 900A in FIG. 9A, the target memory cell may be a specific type of cell (e.g., MLC, TLC, QLC, etc.), which can be programmed to programming levels L1-Ln. For each programming level L1-Ln, a respective PV voltage offset is determined based on the categorized programming level of aggressor memory cell. For example, in a situation where programming level information of 1-bit aggressor memory cell is used, the programming levels of the aggressor memory cell can be categorized as high or low programming level (e.g., C1, C2) since those two categorizations can be represented with a single binary bit. In this example, when the target programming level of the target memory cell is L1, the program component can determine that the effects of the aggressor memory cell programmed to the low programming level C1 may need to use a PV voltage offset X1 less than a default PV voltage, and the program component can determine that the PV voltage used to compensate for the effect of the target memory cells caused by the aggressor memory cells programmed to the high programming level C2 may need a PV voltage offset Y1 less than a default PV voltage used regardless of the programming level to which the target memory cell is being programmed. Similarly, for programming level Ln of the target memory cell, when the aggressor memory cell is to be programmed to the low programming level C1, PV voltage offset Xn is used, and when the aggressor memory cell is to be programmed to the high programming level C2, PV voltage offset Yn is used; and so on. As such, for each programming level of the target memory cell, for each categorized programming level (e.g., based on the 1-bit programming level (e.g., low programming level C1 or high programming level C2)) of the aggressor memory cell, a respective PV voltage offset is used.

Although the programming level information of 1-bit aggressor memory cell is used in the illustration of FIG. 9A for two categorizations, other number of categorizations of programming level of the aggressor memory cell can be used. For example, for each programming level of the target memory cell, in a situation where programming level information of 2-bit aggressor memory cell is used, the programming levels of the aggressor memory cell can be categorized to either be four categorized programming level (e.g., C1, C2, C3, C4), for each categorized programming level of the aggressor memory cell, a respective PV voltage offset can be used.

In an embodiment, instead of providing respective PV voltage offset to each programming level of the target memory cell, certain programming levels of the target memory cell can be grouped such that they can use the same PV voltage offsets, which is illustrated with respect to FIG. 9B. In one example, the program component can initially group the programming levels of the target memory cell into one group, which means that regardless of the programming level to which the target memory cell is being programmed, the same PV voltage offsets are used. In some implementations, having grouped the programming levels into one group, the program component can cycle through a predetermined set of potential PV voltage offset values until the value that maximizes the RWB increase is found. Further, the value that results in the greatest RWB increase for the grouping can be compared to the maximum RWB increase (i.e., the RWB increase resulting from perfect compensation e.g., as calculated by using the Law of Total Variance, to determine the reduction of the spread of the Vt distribution for a particular programming level) to determine whether the target RWB increase is achieved. If the greatest RWB increase that can be obtained using the chosen grouping of the specified cell programming levels is not equal to or greater than the target RWB increase, the program component can divide the programming levels into more groups.

In the example shown in FIG. 9B, the program component can group the programming levels of the target memory cell into two groups. For example, programming levels L0-L3 can be grouped as a first group and programming levels L4-L7 can be grouped as a second group. For example, in a situation where programming level information of 1-bit aggressor memory cell is used, for each programming level in the first group (i.e., L0-L3), when the aggressor memory cell is to be programmed to the low programming level C1, PV voltage offset X3 is used, and when the aggressor memory cell is to be programmed to the high programming level C2, PV voltage offset Y3 is used. For each programming level in the second group (i.e., L4-L7), when the aggressor memory cell is to be programmed to the low programming level C1, PV voltage offset X4 is used, and when the aggressor memory cell is to be programmed to the high programming level C2, PV voltage offset Y4 is used. The grouping of programming levels and identifying the PV voltage offset in the grouping case are illustrated in detail with respect to FIG. 8.

Referring back to FIG. 3, at operation 360, the processing device may cause, during a program verify time period of the program operation, a program verify voltage (Vpv) to be applied to the target wordline to verify programming of the set of target memory cells, where the program verify voltage (Vpv) is adjusted by the PV voltage offset (identified in operation 350).

In some implementations, the processing device may complete the execution of method 300 in response to verifying (using corrective program verify operations 350-360) that all of the programming levels have been programmed (e.g., following the application of set of pulses in accordance with the iterative performance of operations 320-340).

Figure 7A:
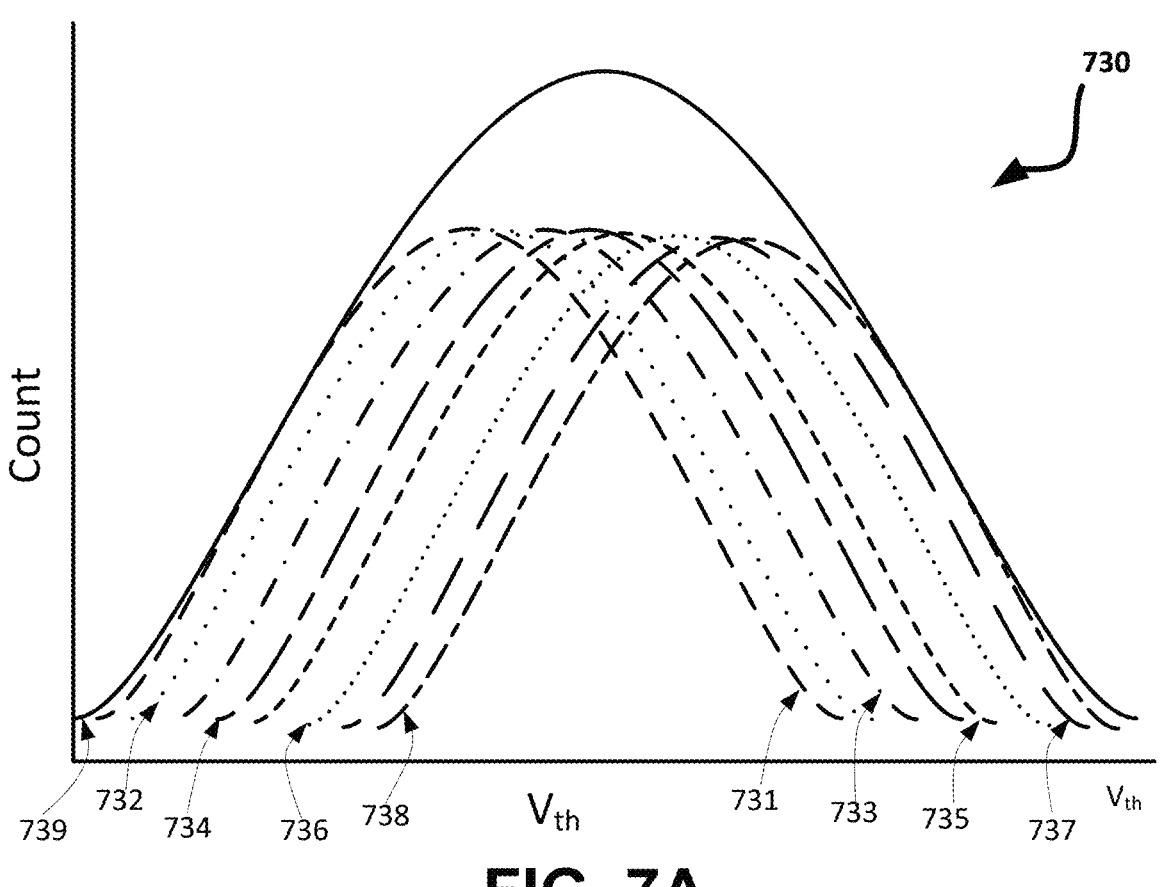
FIG. 7A illustrates an example threshold voltage distribution and its sub distributions in accordance with one or more embodiments of the present disclosure.
Figure 7B:
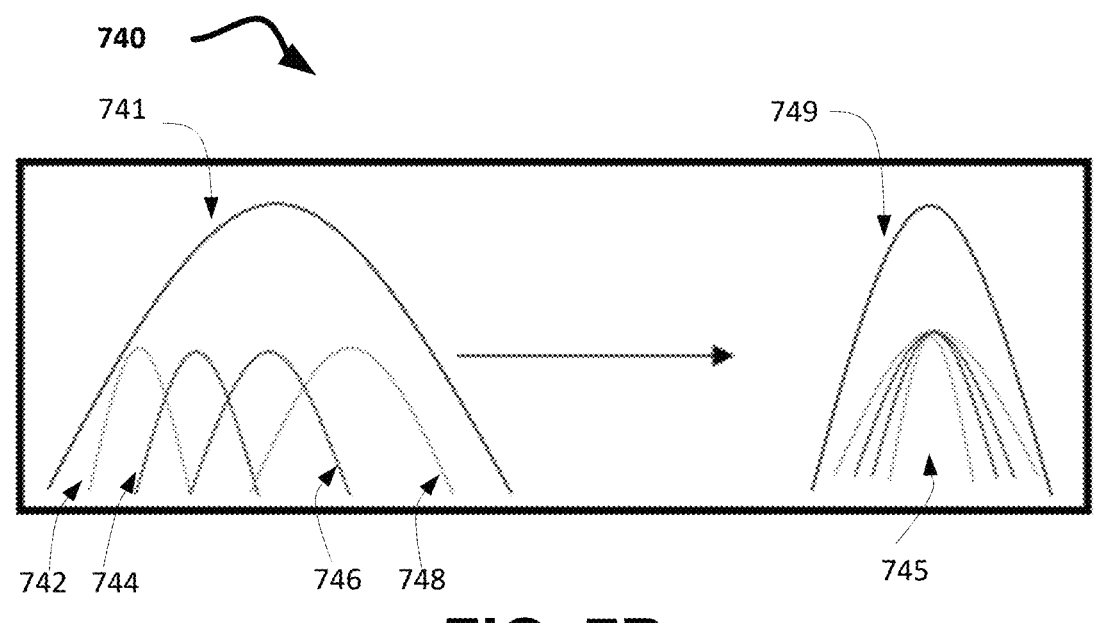
FIG. 7B depicts a plot of threshold voltage distribution and its sub-distributions being aligned to narrow the distribution's spread in accordance with one or more embodiments of the present disclosure.

FIGS. 7A and 7B depict a plot of threshold voltage distribution and its sub-distributions being aligned to narrow the distribution's spread. The program component 134 can compensate for the resulting distributions of Vt of victim cells caused by aggressor cell programming levels. Take for example, a plot 730 of victim cell Vt depicted in FIG. 7A in accordance with an embodiment of the disclosure. The example plot 730 of Vt distributions is associated with of an example group of TLC memory cells programmed to programming level 3. As can be seen, the overarching distribution 739 of Vt for the cells programmed to programming level 3 includes multiple sub-distributions 731-738. Each of these sub-distributions 731-738 reflect the Vt of victim cells programmed to level 3 that happen to have an adjacent aggressor memory cell programmed to a particular programming level that shifts the respective Vt of the victim cell. For example, sub-distribution 731 is a distribution of Vt that is not shifted because the adjacent aggressor cells of the victim cells in the distribution are programmed to programming level 0. In contrast, sub-distribution 732 is shifted due to aggressor memory cells programmed to programming level 1. Sub-distribution 733 is shifted due to aggressor memory cells programmed to programming level 2. Sub-distribution 734 is shifted due to aggressor memory cells programmed to programming level 3. Sub-distribution 735 is shifted due to aggressor memory cells programmed to programming level 4. Sub-distribution 736 is shifted due to aggressor memory cells programmed to programming level 5. Sub-distribution 737 is shifted due to aggressor memory cells programmed to programming level 6. Sub-distribution 738 is shifted due to aggressor memory cells programmed to programming level 7.

Accordingly, it can be seen how the Vt distribution for a set of victim memory cells has sub-distributions of Vt dependent on the programming level of aggressor memory cells. For example, the sub-distribution 738 is shifted to the right relative to the default sub-distribution 731 by a greater amount than sub-distribution 734. This is because the victim cells of sub-distribution 738 are adjacent to aggressor cells of a higher programming level (i.e., 7) than those of sub-distribution 734. Notably, variations of the depicted shifts that are shown for one victim cell programming level can also exist for other programming levels of the victim cell. The other programming levels of the victim cells can likewise be affected by the programming levels of adjacent aggressor cells and have corresponding shifts in their respective sub-distributions.

Thus, in some embodiments, the program component 134 can compensate for these Vt shifts by taking these shifts into consideration when performing read or write operations on the specified memory cells. An example plot resulting from such compensation is depicted in FIG. 7B in accordance with an embodiment of the disclosure. For example, overarching Vt distribution (i.e., for a set of victim memory cells at programming level N) can include sub distributions 742, 744, 746, 748. Each of the sub-distributions can be shifted by a different amount based on a corresponding aggressor cell programming level. In some embodiments, program component 134 can compensate for every one of these Vt shifts that can be caused by every possible corresponding aggressor memory cell programming level and thereby achieve perfect compensation. Perfect compensation can include program component 134 adjusting the parameters of these operations (e.g., by adjusting one or more voltages that are applied) to align the means of the sub-distributions to a single value 745 and thereby narrow the overarching original distribution 741 to the resulting distribution 749. Narrowing the spread of the overarching distribution caused an increase in the RWB.

In some embodiments, to compensate for the shifts, program component 134 can perform corrective program verify operations. For example, program component 134 can adjust PV voltages applied during program operations by an amount corresponding to the shift. This can entail the adjustment of PV voltages to correspond to the resulting voltage distribution of the specified cells when the aggressor cells' effects (e.g., C2C coupling) are taken into consideration. Accordingly, perfect compensation involves compensating for every one of the possible shifts and corresponding shift scenarios. Consequently, it will also result in the maximum possible RWB increase.

Because each shift depends on a particular programming level of an aggressor memory cell, a larger number of possible aggressor memory cell programming levels will entail a larger number of possible shifts to be accounted for. As noted earlier, the aggressor memory cell programming levels can be encoded in or reflected by a sufficient number of bits. For example, 1 bit of information is sufficient to reflect all the possible programming level for an SLC aggressor memory cell. In contrast, to reflect all the possible programming level for a TLC aggressor memory cell, 3 bits of information can be needed. Thus, the program component 134 can use a corresponding number of bits of aggressor memory cell state information for compensation.

Furthermore, in some embodiments, the program component 134 need not perfectly compensate for every possible shift, but can instead partially compensate for them by using fewer bits of aggressor memory cell state information. The program component 134 can group the aggressor memory cell programming levels into groups such that the number of groups reflects that number of bits of aggressor memory cell information needed to determine the group into which an aggressor memory cell falls. For example, the 8 possible programming levels of a TLC memory cell can be grouped into two groups by placing programming levels 1-4 (i.e., representing a relatively low programing level) into group 1 and programming levels 5-8 (i.e., representing a relatively high programing level) into group 2. In this manner, the programming level of a TLC cell can be reflected using 1 bit of information instead of 3 bits. Based on the grouping, program component 134 can partially compensate for the aforementioned shift by adjust the memory access operations in accordance with the number of bits of aggressor memory cell information that are being used. For example, instead of compensating for each possible shift, the shifts caused by programming levels in group 1 can be partially compensated with one voltage offset while the shifts caused by programming levels in group 2 can be partially compensated by another voltage offset.

Consequently, in some embodiments, the program component 134 can use more bits of aggressor memory cell state information to achieve a greater RWB increase and use fewer bits of aggressor memory cell state information to achieve a lesser RWB increase. To do this, the program component 134 can group the aggressor memory cell programming levels into a corresponding number of groups depending on the number of bits of aggressor memory cell state information that are to be used for compensation.

Notably, the RWB increase achieved with compensation is directly correlated with the time and computing resources required to achieve it. In other words, the higher the number of bits of aggressor memory cell state information used by the program component 134 for compensation, the higher the resulting RWB gain and the longer it takes. Accordingly, since in some embodiments each memory cell is located adjacent to one or more corresponding aggressor memory cells, the program component 134 using a higher number of bits of aggressor memory cell state information entails a correspondingly larger cost of the compensation.

Similarly, in some embodiments, the program component 134 need not perfectly compensate for the shifts at every possible programming level of a specified memory cell since storing the parameters of the corrective programming operation for such compensation becomes prohibitive as the number of cells and programming levels to which it is applied increases. Accordingly, in some embodiments, the program component 134 can group the programming levels into groups and apply the same PV voltage offset when programming the memory cells to any of the programming levels within a particular group to achieve a desired RWB increase. In this manner, even without perfect compensation, the program component 134 can optimize compensation for each wordline group on the memory device 130.

In some embodiments, the program component 134 can identify multiple wordline groups on the memory device where each wordline group is associated with a corresponding default program verify (PV) voltage for each respective programming level of a memory cell. For example, a wordline group can include wordlines connected to memory cells that are programmed to programming level L by using default PV voltage V. Another wordline group can include wordlines connected to memory cells that are programmed to programming level M by using default PV voltage W. For example, a TLC cell can have eight programming levels and, consequently, have seven respective default PV voltages (since level 0 representing an erased state of the memory cell does not need to be programmed). The program component 134 can identify wordline groups such that the memory cells connected to the wordlines in each particular group have a common default PV voltage for programming the memory cells to at least one of the possible programming levels.

Further, in several embodiments, the program component 134 can determine, for each wordline group, a maximum read window budget (RWB) increase. Naturally, since the maximum RWB is achieved with perfect compensation, the maximum RWB increase can be associated with using a different PV voltage offset for each respective programming level of a memory cell. For example, each programming level of a specified memory cell can have a different PV voltage offset used during a corrective programming operation to account for possibly different C2C coupling and LM effects at each of those different programming levels. Accordingly, in some embodiments, each PV voltage offset can depend on a respective aggressor memory cell threshold voltage (the effects of which it is intended to counteract).

In some embodiments, the program component 134 can define a target aggregate RWB increase amount based on the maximum RWB increase. For example, in one embodiment, a target RWB increase can be defined in terms of a range of voltage values relative to the maximum RWB increase (e.g., target RWB increase defined to be within N mV of the maximum RWB increase achieved with perfect compensation). Similarly, in another embodiment, a target RWB increase can be defined in terms of a percentage relative to the maximum RWB increase (e.g., target RWB increase defined to be equal to or greater than 70% of the maximum RWB increase achieved with perfect compensation).

In several embodiments, the program component 134 can then determine how to group the programming levels most efficiently to achieve the desired RWB increase. To do this, the program component 134 can calculate the minimum number of programming level groups that can be used to achieve the target RWB increase. For example, in some embodiments, the program component 134 can determine, for each wordline group, a minimum number of memory cell programming level groups, such that each programming level group is associated with a corresponding PV voltage offset applied for programming a memory cell to any programming level within the programming level group, where the minimum number is sufficient to reach the target aggregate RWB increase amount. The aggregate RWB increase can include the sum of RWB increases achieved for programming multiple different cells to multiple different programming levels. In some embodiments, the program component 134 determining the minimum number of memory cell programming level groups can be an iterative process. For examples, determining the minimum number can include the program component 134 dividing multiple memory cell programming levels into a first set of programming level groups having a first number (e.g., 1) of programming level groups. For each group of the first set of programming level groups, the program component 134 can assign a respective PV voltage offset to the programming level group corresponding to a greatest RWB increase for that programming group. In other words, the program component 134 can, by cycling through a pre-determined list of PV voltage offsets, determine the PV voltage offset that, when used to program the cells to one of the programming levels within the programming level group, yields the greatest RWB increase.

Then, the program component 134 can determine whether the target aggregate RWB increase amount is reached using the respective PV voltage offsets for each group of the first set of programming level groups. If the target aggregate RWB increase amount is reached, then the program component 134 can select that grouping as the desired minimum number. For example, in response to the program component 134 determining that the target aggregate RWB increase amount is reached, the program component 134 can select the first number of programming level groups as the minimum number of programming level groups. However, in some cases, the grouping that was initially considered might not be adequate if the greatest RWB increase that results from that grouping does not reach the target aggregate RWB increase. Accordingly, in some embodiments, in response to the program component 134 determining that the target aggregate RWB increase amount is not reached using the respective PV voltage offsets for each programming level group of the first set of programming level groups, the program component 134 can divide multiple memory cell programming levels into a second set of programming level groups having a second number (e.g., 2) of programming level groups different from the first number of programming level groups. The program component 134 can then repeat the previously described determination of whether or not the target aggregate RWB increase is reached using corresponding PV voltage offsets for each of the respective programming level groups in the second set.

The program component 134 can continue increasing the number of programming level groups into which the programming levels of a specified cell can be divided into and checking whether the particular grouping results in the desired RWB increase. In some cases, each programming level group can include a predefined minimum number of programming levels. For example, the program component 134 can be configured to group the programming levels into groups of no less than two programming levels each. Further, the program component 134 determining the minimum number of memory cell programming level groups can eventually, after repeated iterations of the abovementioned process, reach a set of groups such that each programming level is grouped into a separate programming level group. Accordingly, in some embodiments, when the program component 134 has grouped the programming levels into a number of programming level groups that is equivalent to the total number of memory cell programming levels for a memory cell the program component 134 can determine whether perfect compensation by PV voltage adjustment during corrective programming yields the desired RWB increase. In these embodiments, the program component 134 can determine whether the target aggregate RWB increase amount is reached using the respective PV voltage offsets for each programming level group of this set of programming level groups. If the target aggregate RWB increase amount is reached, then the program component 134 can select that grouping as the desired minimum number. For example, in response to the program component 134 determining that the target aggregate RWB increase amount is reached, the program component 134 can select that number (i.e., the number of groups in the latest iteration) of programming level groups as the minimum number of programming level groups. Further, in response to the program component 134 determining that the target aggregate RWB increase amount is not reached using the respective PV voltage offsets for each group of the latest set of programming level groups, the program component 134 can redefine the target aggregate RWB increase amount based on the maximum RWB increase. For example, the program component 134 can define the target RWB increase in terms of a different range of values (e.g., within M mV) or a different percentage (e.g., ≥60%) relative to the maximum RWB increase obtained from perfect compensation.

Having determined the minimum number of programming level groups that will result in the desired RWB increase, the program component 134 can proceed to grouping the programming levels. For example, the program component 134 can group the programming levels of a specified memory cell into the minimum number of programming level groups determined for the wordline group containing the wordline connected to the specified memory cell to define the specific programming level groups. Note that each programming level group will have a corresponding PV voltage offset that is used during a corrective programming operation to program a memory cell to one of the programming levels in that programming level group. Accordingly, in some embodiments, the program component 134 can apply, based on the specific programming level group containing the target programming level (i.e., the programming level to which the cell is desired to be programmed), a corresponding PV voltage offset during a memory cell access operation (e.g., a write operation) to program the specified memory cell to the target programming level. In this manner, a fewer number of PV voltage offsets can be used to compensate for the C2C coupling and LM effects and achieve the target desired aggregate RWB increase. The benefits and advantages of the various embodiments disclosed herein are described in more detail with reference to methods depicted in FIG. 8.

FIG. 8 is a flow diagram of an example method 800 for managing program verify (PV) voltage offsets in memory devices in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the program component 134 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the method 800 can be applied to a memory device having multiple victim cells and aggressor memory cells in one or more arrays. The aggressor memory cells can be defined as aggressors relative to specified memory cells that can be defined as victims based on the effect that the programming level of the aggressor cells has on a threshold voltage adjacent victim memory cells. Each memory cell can be connected to a wordline with physical characteristics that determine a default PV voltage that is used to program the cells connect to that wordline to a particular programming level. Therefore, in some embodiments, the processing logic can, at operation 802, identify multiple wordline groups on the memory device where each wordline group is associated with a corresponding default program verify (PV) voltage for each respective programming level of a memory cell. For example, a TLC cell can have eight programming levels and, consequently, have seven respective default PV voltages (since level 0 representing an erased state of the memory cell does not need to be programmed). The processing logic, at operation 802, can identify wordline groups such that the memory cells connected to the wordlines in each particular group have a common default PV voltage for programming the memory cells to at least one of the possible programming levels.

Further, in several embodiments, the processing logic can, at operation 804, determine, for each wordline group, a maximum read window budget (RWB) increase. Because the maximum RWB is achieved with perfect compensation, the maximum RWB increase determined at operation 804 can be associated with using a different PV voltage offset for each respective programming level of a memory cell. For example, each programming level of a specified memory cell can have a different PV voltage offset used during a corrective programming operation to account for possibly different C2C coupling and LM effects at each of those different programming levels. Accordingly, in some embodiments, each PV voltage offset can depend on a respective aggressor memory cell threshold voltage (the effects of which the offset of the PV voltage is intended to account for).

In some embodiments, the processing logic can, at operation 806, define a target aggregate RWB increase amount based on the maximum RWB increase. For example, the processing logic can, at operation 806, define a target RWB increase in terms of a range of voltage values relative to the maximum RWB increase (e.g., target RWB increase defined to be within L mV of the maximum RWB increase achieved with perfect compensation). Similarly, the processing logic can, at operation 806, define a target RWB increase in terms of a percentage relative to the maximum RWB increase (e.g., target RWB increase defined to be equal to or greater than 80% of the maximum RWB increase achieved with perfect compensation). At operation 808, the processing logic can then determine how to group the programming levels most efficiently to achieve the desired RWB increase. More specifically, the processing logic can calculate, at operation 808, the minimum number of programming level groups that can be used to achieve the target RWB increase. For example, at operation 808, the processing logic can determine, for each wordline group, a minimum number of memory cell programming level groups, such that each programming level group is associated with a corresponding PV voltage offset applied for programming a memory cell to any programming level within the programming level group, where the minimum number is sufficient to reach the target aggregate RWB increase amount. The aggregate RWB increase can include the sum of RWB increases achieved for programming multiple different cells to multiple different programming levels.

Using the determined the minimum number of programming level groups that will result in the desired RWB increase, the processing logic can proceed to grouping the programming levels at operation 810. In some embodiments, the processing logic can, at operation 810, group the programming levels of a specified memory cell into the minimum number of programming level groups determined for the wordline group containing the wordline connected to the specified memory cell to define the specific programming level groups. In some cases, each programming level group can have a corresponding PV voltage offset that is used during a corrective programming operation to program a memory cell to one of the programming levels in that programming level group. Thus, at operation 812, the processing can identify, based on the specific programming level group containing the target programming level (i.e., the programming level to which the cell is desired to be programmed), a corresponding PV voltage offset that is to be used during a memory cell access operation (e.g., a write operation) to program the specified memory cell to the target programming level. In this manner, a fewer number of PV voltage offsets can be used to compensate for the C2C coupling and LM effects and achieve the target desired aggregate RWB increase.

Figure 10:
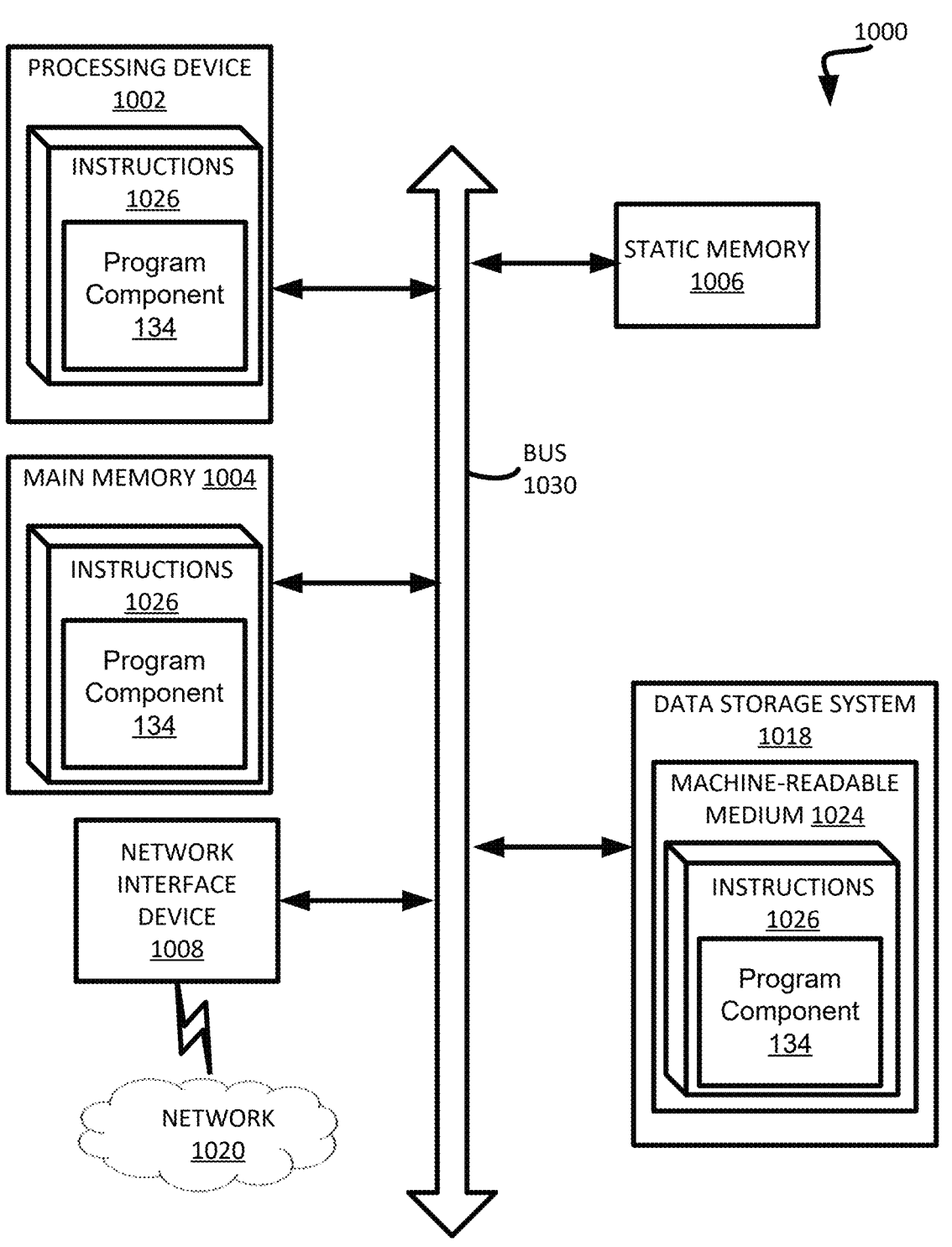
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to program component 134 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium, such as a non-transitory computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1A.

In one embodiment, the instructions 1026 include instructions to implement functionality corresponding to program component 134 of FIG. 1A). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising:
   　a set of target memory cells connected to a target wordline; and
   　a first wordline adjacent to the target wordline, wherein the first wordline is to be programmed immediately subsequent to the target wordline; and
   control logic, operatively coupled with the memory array, to perform operations comprising:
   　causing, during a first time period of a program operation, a ramping wordline voltage to be applied to the set of target memory cells of the target wordline;
   　causing, during the first time period, a disconnection of a set of pillars associated with the set of memory cells from a voltage supply and ground voltage, wherein each pillar corresponds to a respective programming level of a set of programming levels;
   　causing, during a second time period of the program operation, a programming pulse to be applied to the set of target memory cells, wherein the programming pulse programs each programming level of the set of programming levels associated with the set of target memory cells;
   　identify, based on programming level information of the first wordline, a program verify (PV) voltage offset associated with the target wordline; and
   　causing, during a program verify time period of the program operation, a program verify voltage to be applied to the target wordline to verify programming of the set of target memory cells to a target programming level, wherein the program verify voltage is adjusted by the PV voltage offset.

2. The memory device of claim 1, wherein causing the disconnection of the set of pillars comprises causing a toggling of a first select gate drain corresponding to a first pillar of the set of pillars from a first voltage level to ground.

3. The memory device of claim 2, wherein the operations further comprise:
   causing a toggling of a first bitline voltage level of a first bitline corresponding to the first pillar.

4. The memory device of claim 1, wherein causing the disconnection of the set of pillars comprises floating a first pillar of the set of pillars at a first time during the first time period, and wherein a first pillar voltage of the first pillar is incrementally boosted each time the ramping wordline voltage is increased.

5. The memory device of claim 1, wherein causing the disconnection of the set of pillars comprises floating each pillar of the set of pillars in sequence during the first time period.

6. The memory device of claim 1, wherein causing the disconnection of the set of pillars comprises floating, sequentially at intervals of the first time period, a respective pillar of the set of pillars, and wherein, when floating, a pillar voltage corresponding to the respective pillar is boosted in accordance with increases to the ramping wordline voltage.

7. The memory device of claim 1, wherein the PV voltage offset is specific to the target programming level.

8. The memory device of claim 1, wherein the programming level information of the first wordline depends on a number of bits of information reflecting a threshold voltage of one or more aggressor memory cells of the first wordline.

9. The memory device of claim 1, wherein identify, based on the programming level information of the first wordline, the program verify (PV) voltage offset associated with the target wordline further comprises:

identifying a plurality of wordline groups of the memory array, wherein each wordline group of the plurality of wordline groups is associated with a corresponding default program verify (PV) voltage for each respective programming level of a memory cell of the set of target memory cells;

determining, for each wordline group of the plurality of wordline groups, a maximum read window budget (RWB) increase associated with using a different program verify (PV) voltage offset for each respective programming level of a memory cell of the set of target memory cells, wherein each PV voltage offset depends on a respective threshold voltage of an aggressor memory cell;

defining a target aggregate RWB increase amount based on the maximum RWB increase;

determining, for each wordline group of the plurality of wordline groups, a minimum number of programming level groups, wherein each programming level group is associated with a corresponding PV voltage offset applied for programming the set of target memory cells to any programming level within the programming level group, and wherein the minimum number is sufficient to reach the target aggregate RWB increase amount;

grouping the programming levels of the set of target memory cells into the minimum number of programming level groups determined for the wordline group containing the target wordline connected to the set of target memory cells to define one or more specific programming level groups; and identifying, based on the specific programming level group containing the target programming level, a corresponding PV voltage offset.

10. A method comprising:

causing, by a processing device coupled with a memory array, during a first time period of a program operation, a ramping wordline voltage to be applied to a set of target memory cells of a target wordline, wherein the memory array comprises the set of target memory cells connected to the target wordline and a first wordline adjacent to the target wordline, and wherein the first wordline is to be programmed immediately subsequent to the target wordline;

causing, during the first time period, a disconnection of a set of pillars associated with the set of memory cells from a voltage supply and ground voltage, wherein each pillar corresponds to a respective programming level of a set of programming levels;

causing, during a second time period of the program operation, a programming pulse to be applied to the set of target memory cells, wherein the programming pulse programs each programming level of the set of programming levels associated with the set of target memory cells;

identify, based on programming level information of the first wordline, a program verify (PV) voltage offset associated with the target wordline; and causing, during a program verify time period of the program operation, a program verify voltage to be applied to the target wordline to verify programming of the set of target memory cells to a target programming level, wherein the program verify voltage is adjusted by the PV voltage offset.

11. The method of claim 10, wherein causing the disconnection of the set of pillars comprises causing a toggling of a first select gate drain corresponding to a first pillar of the set of pillars from a first voltage level to ground.

12. The method of claim 11, further comprising:

causing a toggling of a first bitline voltage level of a first bitline corresponding to the first pillar.

13. The method of claim 10, wherein causing the disconnection of the set of pillars comprises floating a first pillar of the set of pillars at a first time during the first time period, and wherein a first pillar voltage of the first pillar is incrementally boosted each time the ramping wordline voltage is increased.

14. The method of claim 10, wherein causing the disconnection of the set of pillars comprises floating each pillar of the set of pillars in sequence during the first time period.

15. The method of claim 10, wherein causing the disconnection of the set of pillars comprises floating, sequentially at intervals of the first time period, a respective pillar of the set of pillars, and wherein, when floating, a pillar voltage corresponding to the respective pillar is boosted in accordance with increases to the ramping wordline voltage.

16. The method of claim 10, wherein the PV voltage offset is specific to the target programming level.

17. The method of claim 10, wherein the programming level information of the first wordline depends on a number of bits of information reflecting a threshold voltage of one or more aggressor memory cells of the first wordline.

18. A non-transitory computer readable medium comprising instructions, which when executed by a processing device coupled with a memory array, cause the processing device to perform operations comprising:

causing, during a first time period of a program operation, a ramping wordline voltage to be applied to a set of target memory cells of a target wordline, wherein the memory array comprises the set of target memory cells connected to the target wordline and a first wordline adjacent to the target wordline, and wherein the first wordline is to be programmed immediately subsequent to the target wordline;

causing, during the first time period, a disconnection of a set of pillars associated with the set of memory cells from a voltage supply and ground voltage, wherein each pillar corresponds to a respective programming level of a set of programming levels;

causing, during a second time period of the program operation, a programming pulse to be applied to the set of target memory cells, wherein the programming pulse programs each programming level of the set of programming levels associated with the set of target memory cells;

identify, based on programming level information of the first wordline, a program verify (PV) voltage offset associated with the target wordline; and causing, during a program verify time period of the program operation, a program verify voltage to be applied to the target wordline to verify programming of the set of target memory cells to a target programming level, wherein the program verify voltage is adjusted by the PV voltage offset.

19. The non-transitory computer readable medium of claim 18, wherein the PV voltage offset is specific to the target programming level.

20. The non-transitory computer readable medium of claim 18, wherein the programming level information of the first wordline depends on a number of bits of information reflecting a threshold voltage of one or more aggressor memory cells of the first wordline.

\* \* \* \* \*